(12) United States Patent
Huang et al.

(10) Patent No.: US 11,417,700 B2
(45) Date of Patent: *Aug. 16, 2022

(54) IMAGE SENSING DEVICE AND MANUFACTURING METHOD THEREOF

(71) Applicant: TAIWAN SEMICONDUCTOR MANUFACTURING COMPANY LTD., Hsinchu (TW)

(72) Inventors: Chih-Chang Huang, Chiayi (TW); Chi-Ming Lu, Kaohsiung (TW); Jian-Ming Chen, Chiayi (TW); Jung-Chih Tsao, Tainan (TW); Yao-Hsiang Liang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/989,706

(22) Filed: Aug. 10, 2020

(65) Prior Publication Data

US 2020/0373345 A1 Nov. 26, 2020

Related U.S. Application Data

(60) Continuation of application No. 16/223,712, filed on Dec. 18, 2018, now Pat. No. 10,741,601, which is a continuation of application No. 15/624,055, filed on Jun. 15, 2017, now Pat. No. 10,157,953, which is a
(Continued)

(51) Int. Cl.
*H01L 27/146* (2006.01)
*H01L 21/768* (2006.01)

(52) U.S. Cl.
CPC .. *H01L 27/14636* (2013.01); *H01L 21/76802* (2013.01); *H01L 21/76843* (2013.01); *H01L 21/76856* (2013.01); *H01L 21/76889* (2013.01); *H01L 27/1463* (2013.01); *H01L 27/1464* (2013.01); *H01L 27/14612* (2013.01); *H01L 27/14621* (2013.01); *H01L 27/14623* (2013.01); *H01L 27/14625* (2013.01); *H01L 27/14627* (2013.01); *H01L 27/14645* (2013.01);
(Continued)

(58) Field of Classification Search
None
See application file for complete search history.

(56) References Cited

U.S. PATENT DOCUMENTS

2010/0091163 A1* 4/2010 Liao ................... H01L 27/14603
348/308
2010/0155954 A1* 6/2010 Mukherjee ........ H01L 21/28518
257/754

(Continued)

*Primary Examiner* — Khaja Ahmad
(74) *Attorney, Agent, or Firm* — WPAT, P.C., Intellectual Property Attorneys; Anthony King

(57) ABSTRACT

Some embodiments of the present disclosure provide a back side illuminated (BSI) image sensor. The back side illuminated (BSI) image sensor includes a semiconductive substrate and an interlayer dielectric (ILD) layer at a front side of the semiconductive substrate. The ILD layer includes a dielectric layer over the semiconductive substrate and a contact partially buried inside the semiconductive substrate. The contact includes a silicide layer including a predetermined thickness proximately in a range from about 600 angstroms to about 1200 angstroms.

20 Claims, 25 Drawing Sheets

Related U.S. Application Data division of application No. 14/689,838, filed on Apr. 17, 2015, now Pat. No. 9,691,804.

(52) U.S. Cl.
CPC .. *H01L 27/14685* (2013.01); *H01L 27/14689* (2013.01); *H01L 27/14698* (2013.01)

(56) References Cited

U.S. PATENT DOCUMENTS

| | | | |
|---|---|---|---|
| 2013/0113027 A1* | 5/2013 | Chiang | H01L 29/518 257/288 |
| 2013/0316535 A1* | 11/2013 | Shin | H01L 29/161 438/682 |
| 2014/0154856 A1* | 6/2014 | Alptekin | H01L 29/66575 438/299 |
| 2014/0162424 A1* | 6/2014 | Hung | H01L 29/66628 438/300 |
| 2014/0191329 A1* | 7/2014 | Rivero | H01L 21/76805 257/383 |

* cited by examiner

IMAGE SENSING DEVICE AND MANUFACTURING METHOD THEREOF

CROSS-REFERENCE TO RELATED APPLICATIONS

This application is a continuation of U.S. application Ser. No. 16/223,712, filed on Dec. 18, 2018, which is a continuation of U.S. application Ser. No. 15/624,055, filed on Jun. 15, 2017, which is a division of U.S. application Ser. No. 14/689,838, filed on Apr. 17, 2015. All of the above-referenced applications are hereby incorporated herein by reference in their entirety.

FIELD

The present disclosure relates to a back side illuminated (BSI) image sensor.

BACKGROUND

Image sensors are widely used in various imaging applications and products, such as cameras, scanners, photocopiers, etc. A performance of an image sensor is depended on quality of pixels in the image sensors. As a part of IC evolution for semiconductor image sensors, the size of pixels has been steadily reduced. As the size of pixels continue to shrink, quality of pixels become more difficult to control.

The quality of pixels can affect performance such as an amount of dark current. The dark current is one of sources for noise in the image sensors. The dark current is referred to as a leakage current in non-optical devices such as in transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
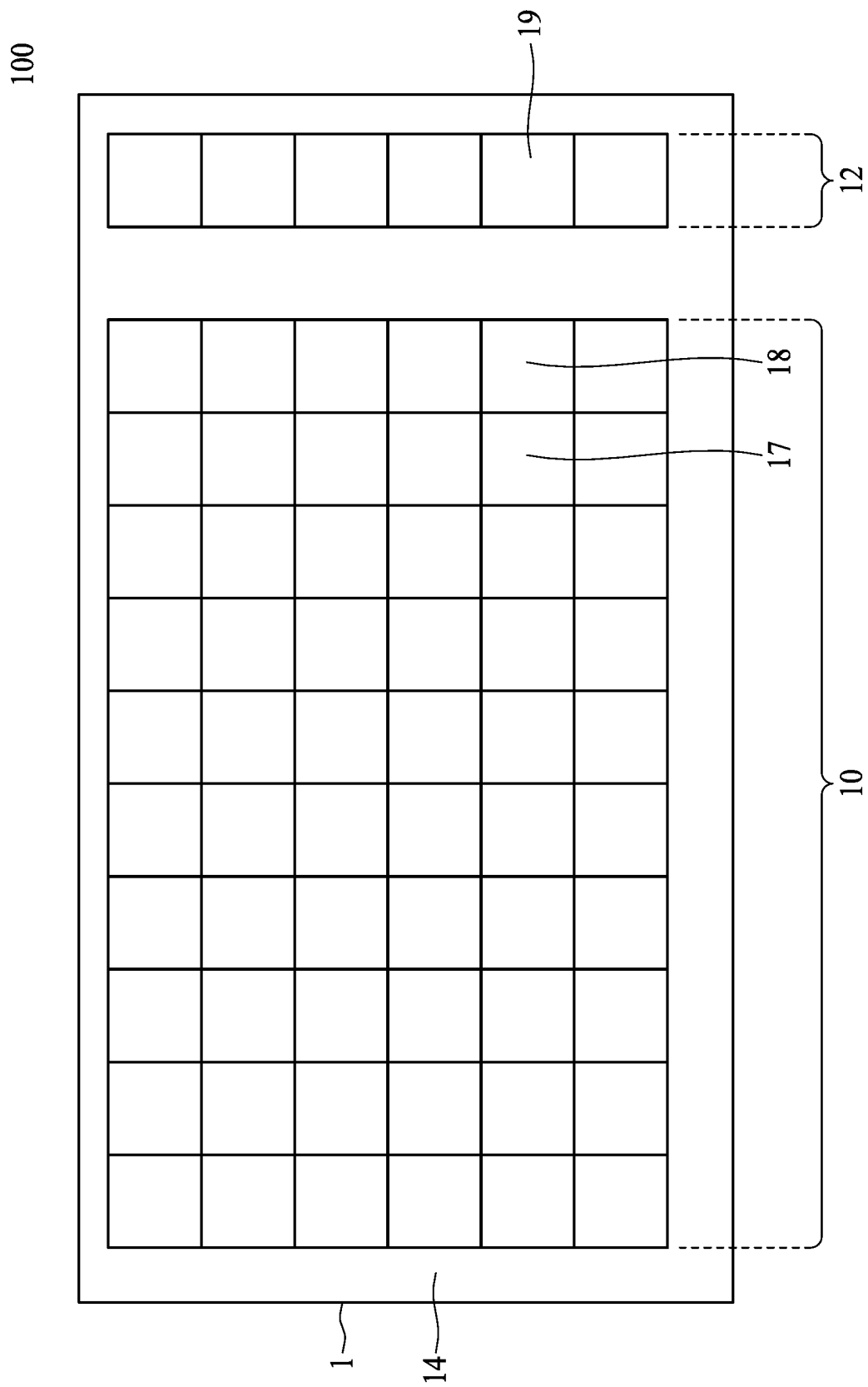
FIG. 1 is a plan view of an image sensor with some pixels, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A performance of an image sensor is affected by a quality of a pixel in the image sensor. The quality of the pixel is controlled during a manufacture of the image sensor. A damaged pixel can cause dark current and produce false image signal. A black pixel is a pixel unable to produce electric current flowing through the image sensor when photons are entering the image sensor. The black pixel fails to produce a proper image signals. One of a cause of the black pixel is a high resistance in a material for transmitting electric signals in the image sensor. One of a place to reduce a resistance in the image sensor is a silicide region between a contact and a semiconductive substrate.

In FIG. 1, an image sensor 100 is illustrated. FIG. 1 is a schematic plan view of an image sensor 100 in accordance with some embodiments. The image sensor 100 includes a semiconductive substrate 1. The semiconductive substrate 1 includes a pixel array region 10 and a logic region 14 outside the pixel array region 10. The pixel array region 10 includes one or more pixel regions 17 and 18 arranged therein in a pixel array. The pixel regions 17 and 18 are configured to convert light to image data. In some embodiments, the pixel array region 10 includes complementary metal-oxide-semiconductor (CMOS), and the image sensor 100 is a CMOS image sensor (CIS). In some embodiments, the pixel regions 17 and 18 are charged coupled device (CCD) image sensors. In some embodiments, the pixel regions 17 and 18 are monochromatic pixels. In some other embodiments, the pixel regions 17 and 18 are color pixels such as blue (B), green (G), or red (R) pixels configured to detect different colors in an incident light. The image sensor 100 further includes one or more black level reference pixels 19 arranged in a black level reference pixel array 12. The black level reference pixels 19 are similar or identical to the pixel regions 17 and 18, except that light is blocked to prevent the black level reference pixels 19 from receiving light. Image data outputted by the black level reference pixels 19 provides a black level that is referenced for calibrating the image sensor 100. In some embodiments, the black level reference pixels 19 are omitted.

Figure 2:
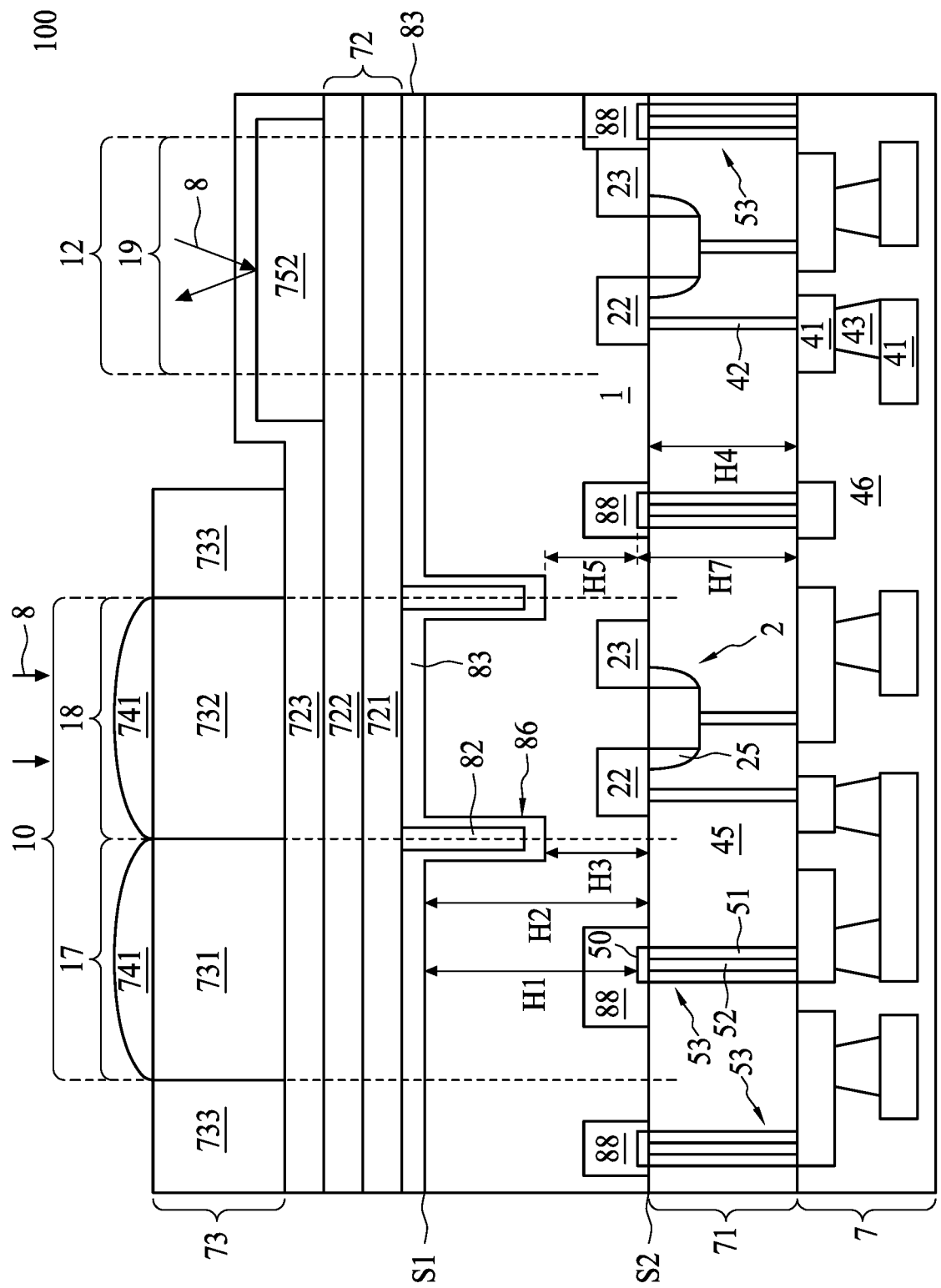
FIG. 2 is a cross-sectional view of an image sensor, in accordance with some embodiments of the present disclosure.

FIG. 2 is a cross sectional view of image sensor 100. In some embodiments, image sensor 100, 200, 300, or 500 in FIG. 2, 3, 4, or 9 is a back side illuminated (BSI) image sensor. The image sensor 100 includes the pixel array region 10 and black level reference pixel array 12.

Pixel array region 10 includes pixel region 17 and pixel region 18. The pixel regions 17 and 18 are separated by deep trench isolation (DTI) 86. Pixel region 18 includes a transistor 2. The transistor 2 includes a gate structure 21, a gate spacer 25, a photosensitive element 22, and a photosensitive element 23 or 22. Pixel region 17 and pixel region 18 are defined by the deep trench isolations DTI 86 at a boundary of pixel region 17 or 18. Semiconductive substrate 1 includes deep trench isolation (DTI) 86 at a back side S1 of the semiconductive substrate 1. DTI 86 is under back side S1. A top surface of DTI 86 is coplanar with back side S1. A top surface of protective layer 83 is above back side S1.

Black level reference pixel 19 is structured in black level reference pixel array 12. A light shielding layer 752 is under the capping layer 723. Light shielding layer 752 prevents incident light 8 reaching the light shielding layer 752 from transmitting to the photosensitive element 22 or 23. The photosensitive element 22 or 23 is coupled with the transistor 2. In some embodiments, contact plug 53 is in proximity to a photo diode such as photosensitive elements 22 or 23. The black level reference pixel 19 is configured to output image data from the transistor 2 to a logic transistor (not shown) through the contacts 42 and the interconnection 41.

Image sensor 100 includes multilayer structure 72 above semiconductive substrate 1. Color filter array 73 is above multilayer structure 72. Microlenses 741 are above color filter array 73. Image sensor 100 includes interlayer dielectric (ILD) layer 71 below semiconductive substrate 1. Redistribution layer 7 is below ILD layer 71.

The multilayer structure 72 includes a first transmitting layer 721, a second transmitting layer 722, and a capping layer 723. The multilayer structure 72 is disposed over the back side S1 of the semiconductive substrate 1. A bottom surface of transmitting layer 721 is in contact with a top surface of reflective material 82 within the DTI 86.

In some embodiments, the pixel array region 10 includes color filter 731, 732, or 733 in color filter array 73 disposed proximate to back side S of the semiconductive substrate 1. The back side S1 is opposite of the front side S2. In some other embodiments, the multilayer structure 72 is arranged with an increasing refractive index from air outside the image sensor 100 to the semiconductive substrate 1.

In an embodiment, the semiconductive substrate 1 is made from silicon. The semiconductive substrate 1 includes bulk silicon, a semiconductor wafer, a silicon-on-insulator (SOI) substrate, or a silicon germanium substrate. Other semiconductor materials including group III, group IV, and group V elements are used in some embodiments. The semiconductive substrate 1 is undoped in some embodiments. Contact plug 53 is in contact with undoped regions in semiconductive substrate 1. In some other embodiments, the semiconductive substrate 1 is doped with a p-type dopant or an n-type dopant. Doped regions such as the photo diodes are proximate to contact plug 53. Back side S1 is at a top of the semiconductive substrate 1. Front side S2 is at a bottom of the semiconductive substrate 1.

Reflective material 82 is in the DTI 86 and borders with protective layer 83. Reflective material 82 is in contact with multilayer structure 72 near back side SL. Reflective material 82 serves as an optical separation to configured pixel regions 17 and 18 such that light would keep within each individual pixel region 17 or 18. In some embodiments, reflective material 82 is made of a conductive material. The conductive material is configured to reflect light. Reflective material 82 is made of conductive materials such as aluminum, copper, titanium nitride, tungsten, tantalum, tantalum nitride, nickel silicide, cobalt silicide, other suitable materials, and/or combinations thereof. The Reflective material 82 functions to prevent light from one pixel region 17 makes its way into a neighboring pixel region 18, thereby causing the neighboring pixel region 18 to sense the light by transistor 2.

In some embodiments, DTI 86 is replaced by a shallow trench isolation (STI) features or a local oxidation of silicon (LOCOS) features. The DTI 86 defines and isolates various elements or regions from each other in the semiconductive substrate 1. For example, the DTI 86 isolates adjacent pixel region 17 or 18 from each other, the pixel array region 10 from black level reference pixel 19, or some components of the circuitry inside a logic region from each other. In some embodiments, a boundary between pixel region 17 and 18 is void of DTI 86. In some embodiments, DTI 86 is made of a dielectric material or insulator materials such as silicon oxide, silicon nitride, or silicon oxynitride. In some embodiments, the DTI 86 is a multi-layer structure including layer such as a thermal oxide liner layer with silicon nitride or silicon oxide inside the thermal oxide liner layer. In some embodiments, reflective material 82 includes the silicon nitride or silicon oxide.

In FIG. 2, semiconductive substrate 1 includes photosensitive element 22, and photosensitive element 23 at a front side S2 of the semiconductive substrate 1. Photosensitive element 22 and photosensitive element 23 are above the front side S2 and within semiconductive substrate 1. In some embodiments, photosensitive elements 22, or 23 is a photo diode proximate to contact plug 53, gate structure 21, or gate spacer 25.

In some embodiments, the photosensitive element 22 or the photosensitive element 23 are a drain region or a source region. In some embodiments, photosensitive element 22 or 23 is replaces by a doped drain or source region. Photosensitive element 22 or 23 is configured to receive light 8 (B, G or R). The light 8 is incident upon a microlens 741, transmitted through color filter array 73 and a multilayer structure 72, and traveled toward the back side S1 into the semiconductive substrate 1. The light 8 is then converted by the photosensitive element 22, or 23 into electrical current. The electrical current is transmitted through contact 42 and/or contact plug 53 as image data.

Transistor 2 is connected with the photosensitive element 22 or 23 at a front side S2 of the semiconductive substrate 1. Transistor 2 includes a gate structure 21 and gate spacer 25 below front side S2. An interconnection 41 coupled with the transistor 2 through a contact 42. Interconnection 41 coupled with contact plug 53. In some embodiments, the transistor 2 is a transfer transistor for transferring the image data captured by a corresponding photosensitive element 22 or 23 to external circuitry. In some embodiments, additional transistors with various functions are also included in each pixel array region 10. Other CIS arrangements are suitable in some embodiments. The principles described herein are also applicable to CCD pixels in further embodiments. In some embodiments, other transistors in pixel array region 10 are structured similarly to the transistor 2.

The ILD layer 71 is at front side S2. ILD layer 71 is below semiconductive substrate 1. ILD layer 71 includes a height H4 from front side S2 to redistribution layer 7. ILD layer 71 includes dielectric layer 45 below front side S2. Contacts 42 and contact plug 53 are buried inside dielectric layer 45. Contacts 42 are connected with gate structure 21, photosensitive element 22, or photosensitive element 23 of transistor 2. Contact plugs 53 are coupled to non-salicide region 88. Non-salicide region 88 is a portion of semiconductive substrate 1 void of dopant, metal, salicide, or silicide. Non-salicide region 88 is also a silicon portion. In some embodiments, non-salicide region 88 is proximate front side S2.

Contact plug 53 is connected to the silicon portion of semiconductive substrate 1. The silicon portion is composed of a material void of metal, silicide, salicide, or dopant. The silicon portion is a non-silicide portion. Contact plug 53 includes a height H7. Contact plug 53 is partially buried inside the semiconductive substrate 1 such that contact plug 53 is protruding above ILD layer 71. In some embodiments, height H7 is larger than height H4.

Contact plug 53 includes a silicide layer 50 at a top near front side S2. Silicide layer 50 is in contact with front side S2. Silicide layer 50 is inside semiconductive substrate 1. Silicide layer 50 is distanced from back side S1 by a height H1. Front side S2 is distanced from back side S1 by a height H2. DTI 86 is distanced from front side S2 by a height H3. Silicide layer 50 is distanced from reflective material 82 of DTI 86 by a height H5. Height H1, H2, H3, H4, or H5 are measured vertically in a direction orthogonal to front side S2 or back side S1.

Contact plug 53 includes silicide layer 50 inside non-salicide region 88. In some embodiments, silicide layer 50 is composed of self-aligned silicide (salicide). Silicide layer 50 is a salicide layer 50 including a titanium element. The Silicide layer 50 is above the front side S2 of the semiconductive substrate 1. Contact plug 53 includes a barrier layer 51 in contact with silicide layer 50. In some embodiments, a thin film of conductive material such as titanium is between barrier layer 51 and dielectric layer 45. Barrier layer 51 includes any suitable conductive material such as TiN, W, Ti, Mo, Co, Pt, TiW, Ta, TaN, TaSiN, or WN. In some embodiments, barrier layer 51 serves as an adhesion promoter or a diffusion barrier. The adhesion promoter provides suitable adhesion strength between dielectric materials in dielectric layer 45 and conductive material 52. The diffusion barrier serves to prevent diffusion of materials inside conductive material 52. The diffusion barrier serves to prevent intermixing of materials inside conductive material 52 with material in silicide layer 50 or with material in dielectric layer 45. In some embodiments, barrier layer 51 is a thin film between silicide layer 50 and conductive material 52. Conductive material 52 is inside contact plug 53. Conductive material 52 is in contact with barrier layer 51. Barrier layer 51 is lined conformally to conductive material 52. Conductive material 52 is composed of any suitable material such as metal including W, Ti, Cu, or Al. Contact plug 53 couples between interconnection 41 and semiconductive substrate 1.

Contacts 42 are connected to interconnection 41 in a redistribution layer 7. Redistribution layer 7 is under the dielectric layer 45 and the contacts 42 in the ILD layer 71. The redistribution layer 7 includes an interconnection 41 coupled with the contacts 42. The redistribution layer 7 includes alternating some conductive layers and some dielectric layers 46. The conductive layers are patterned and/or otherwise processed to form the interconnections 41 coupled to some devices (e.g., the transistors 2) and/or between the devices and some external circuitries. The interconnections 41 are coupled to the devices through the contacts 42 or contact plugs 53. The interconnection 41 is coupled to another interconnection 41 in other layer through a via 43.

The contacts 42 are disposed in the dielectric layer 45. Contacts 42, contact plugs 53, or dielectric layer 45 are in the pixel array region 10, or the black level reference pixel array 12. The ILD layer 71 includes contact plug 53, the contacts 42, and the dielectric layer 45. Contacts 42 are connected to photosensitive element 22 or 23 at front side S2. Contacts 42 and contact plugs 53 are connected to interconnection 41 at an interface between ILD layer 71 and redistribution layer 7. The inter-layer dielectric (ILD) layer 71 is under the front side S2 of the semiconductive substrate 1. The ILD layer 71 includes dielectric layer 45 made of material such as, boron phosphorous silicate glass (BPSG), plasma enhanced tetra-ethyl-ortho-silicate (PE-TEOS), or any other suitable dielectric materials. In some embodiments, contact 42 or conductive material 52 is made of materials such as aluminum, copper, titanium nitride, tungsten, titanium, tantalum, tantalum nitride, nickel silicide, cobalt silicide, TaC, TaSiN, TaCN, TiAl, TiAlN, other suitable materials, and/or combinations thereof.

Figure 3:
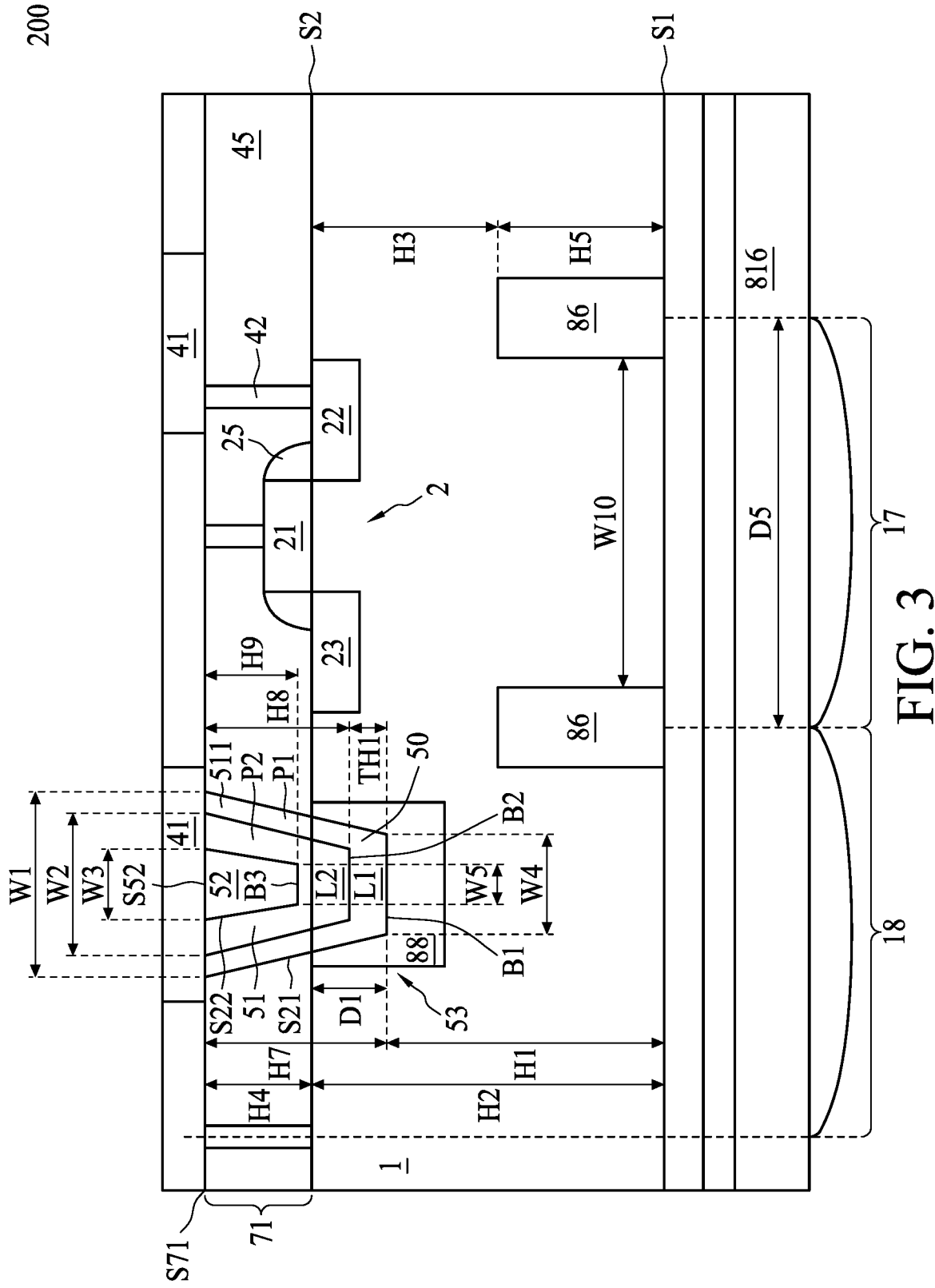
FIG. 3 is a cross-sectional view of an image sensor, in accordance with some embodiments.

FIG. 3 illustrates image sensor 200 similar to the image sensor 100 in FIG. 2. The silicide layer 50 includes lateral portion P1, and lower portion L1. In FIG. 3, barrier layer 51 is in between silicide layer 50 and conductive material 52 inside contact plug 53.

In FIG. 3, contact plug 53 includes bottom side B. A depth D1 of contact plug 53 is measured from front side S2 to bottom side B1 of contact plug 53. A height H1 is measured from back side S1 to bottom side B1. A width W1 of contact plug 53 is measured from one lateral side S21 of a contact plug 53 to another lateral side S21 of the same contact plug 53. An aspect ratio of contact plug 53 is a ratio between height H7 and width W1.

Silicide layer 50 is a lower portion L1 of contact plug 53. Lower portion L1 includes a bottom side B1. Lower portion L1 is bordering with lower portion L2 of barrier layer 51 at bottom side B2. Bottom side B2 is an interface between lower portion L1 and lower portion L2. A distance between bottom side B2 and bottom side B1 is thickness TH1 of silicide layer 50. In some embodiments, silicide layer 50 includes a predetermined thickness TH1 proximately in a thickness range from about 600 angstroms to about 1200 angstroms. The thickness range is designed to a suitable range such that a resistance of non-salicide region 88 is sufficiently small. In some embodiments, thickness TH is smaller than depth D1 of contact plug 53. In other embodiments, thickness TH1 is substantially the same as depth D1. In further embodiments, thickness TH1 is larger than depth D1. Bottom side B1 includes a width W4. Bottom side B1 includes a surface substantially flat. Bottom side B1 and bottom side B2 are substantially parallel with front side S2. Bottom side B1 is in contact with semiconductive substrate 1. In some embodiments, lateral side S21 of contact plug 53 is tapered such that silicide layer 50 is in a trapezoidal shape and bottom side B1 is smaller than bottom side B2. In some other embodiments, a size of bottom side B1 is substantially the same as a size of bottom side B2. In some further embodiments, a size of bottom side B1 is larger than a size of bottom side B2. Bottom side B2 extends from one lateral side S21 to another lateral side S21. Bottom side B2 is distanced from a top surface S71 of ILD layer 71 by a height H8. In some embodiments, bottom side is under front side S2 such that height H8 is greater than height H4 of ILD layer 71. In some other embodiments, bottom side B2 is substantially coplanar with front side S2 such that height H8 is substantially the same with height H4 of ILD layer 71. In some further embodiments, bottom side B2 is substantially above front side S2 such that height H8 is substantially shorter height H4 of ILD layer 71. Contact plug 53 includes a lateral portion P1. Lateral portion P1 is compose of metallic elements such as Ti.

Barrier layer 51 includes a lateral portion P2. Lateral portion P2 is lined to a lateral side S22 of conductive material 52. Lateral side S22 is parallel with lateral side S21 of contact plug 53. Lower portion L2 of barrier layer 51 is lined to bottom side B3 of conductive material 52. Bottom side includes a width W5. In some embodiments, barrier layer 51 is a thin film such that thickness of lower portion L2 is small and an area of bottom side B3 is the same as an area of bottom side B2. Width W5 is substantially larger than or equal to width W4. Bottom side B3 is distanced from the top surface S71 of ILD layer 71 by a height H9. Height H9 is a depth of conductive material 52. Barrier layer 51 includes a width W2 measured along top surface S71. Top surface S71 is parallel with front side S2. Width W2 is substantially the same as width W1. A top of barrier layer 51 is in contact with interconnection 41. Barrier layer 51 lined conformally on top of the silicide layer 50 near bottom side B2. In some embodiments, lateral portion P1 is a thin film 511 lined to lateral portion P2 of barrier layer 51.

Conductive material 52 is partially surrounded by barrier layer 51 at bottom side B3 and at lateral side S22. Conductive material 52 is in contact with interconnection 41 at a top of conductive material 52. Conductive material 52 includes a width W3 measured along top surface S71. Conductive material 52 includes a top surface S52 substantially coplanar with top surface S71. Top surface S52 is an interface between conductive material 52 and interconnection 41. In some embodiments, top surface S52 is larger than bottom side B2 or bottom side B1. Conductive material 52 is a conductive plug over the salicide layer such as silicide layer 50. Width W4 of bottom side B1 is larger than, equal to, or smaller than width W3 of conductive material 52. Bottom side B1 is an interface between silicide layer 50 and non-salicide region 88 of semiconductive substrate 1. A portion of semiconductive substrate 1 such as non-salicide region 88 surrounding silicide layers 50 is void of metal or dopant.

Height H1, H2, H4, H7, H8, H9, depth D1, and thickness Th1 are measured vertically in a direction orthogonal to front side S2. Width W1, W2, W3, W4, W5, and W10 are measured horizontally in a direction parallel with front side S2.

Figure 4:
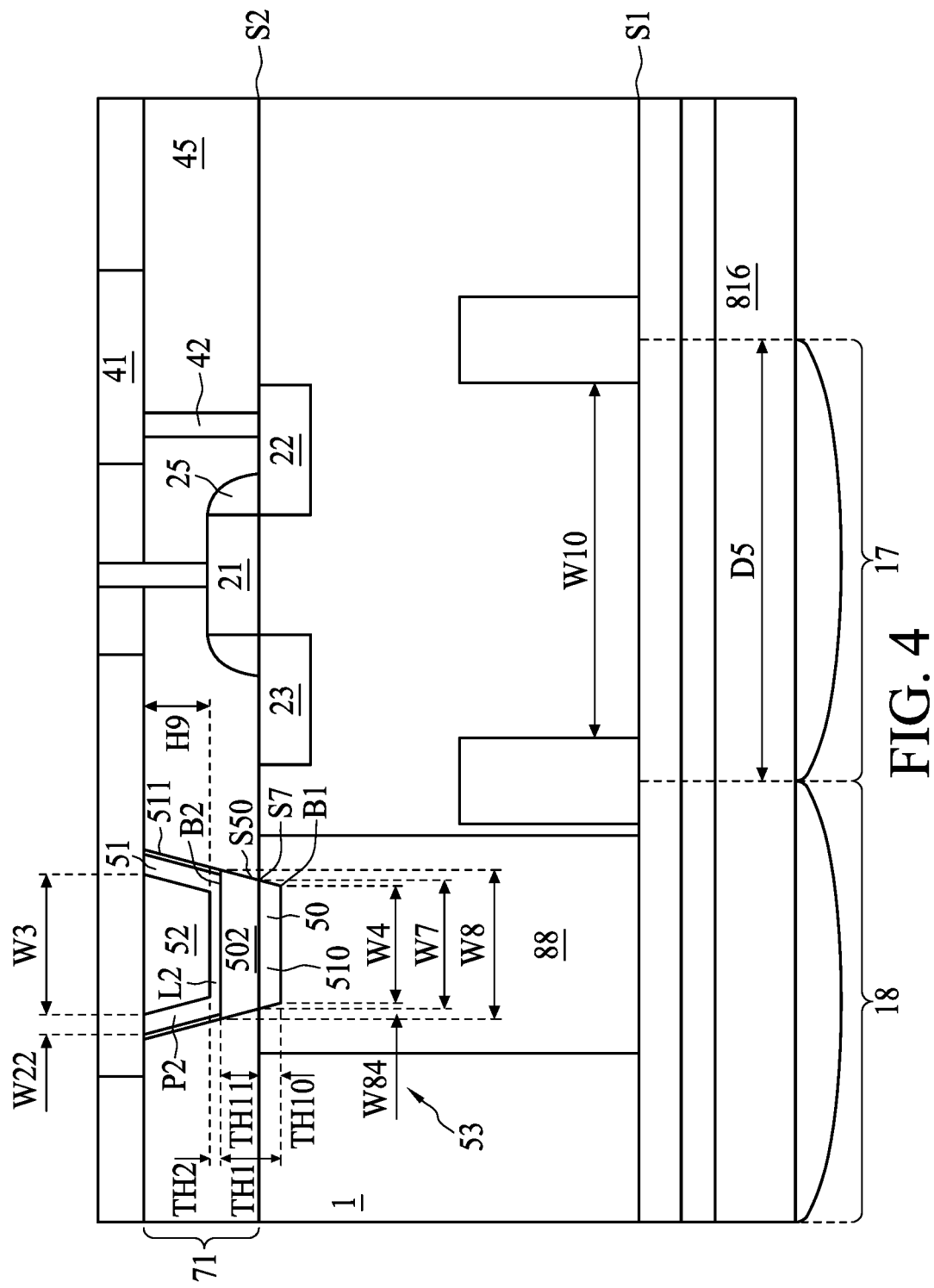
FIG. 4 is a cross-sectional view of an image sensor, in accordance with some embodiments.

FIG. 4 illustrates image sensor 300 similar to the image sensor 200 in FIG. 3. In FIG. 4, the silicide layer 50 is a salicide layer partially below the front side S2 of the semiconductive substrate 1 such that a bottom portion 510 below the front side S2 is larger than a top portion 502 above the front side S2. Silicide layer 50 is partially buried in non-salicide region 88 of semiconductive substrate 1. Thin film 511 is in contact with top portion 502 near bottom side B2. In some embodiments, bottom side B2 is a top surface of salicide layer 50. Thin film 511 is composed of metal such as titanium. A top of thin film 511 is in contact with interconnection 41.

In FIG. 4, silicide layer 50 includes a thickness TH1. Top portion 502 includes a thickness TH11. Bottom portion 510 includes a thickness TH10. In some embodiments, thickness TH11 is smaller than thickness TH10. Bottom portion 510 includes a width W4 at bottom side B1. An interface between top portion 502 and bottom portion 510 is surface S7. Surface S7 includes a width W7 measured in a direction along front side S2. An interface between top portion 502 and barrier layer 51 is bottom side B2. Bottom side B2 includes a width W8. In some embodiments, width W8 is larger than width W7. In some other embodiments, width W8 is equal to width 7. In some further embodiments, width W8 is smaller than width W7. In some embodiments, width W7 is larger than width W4. In some other embodiments, width W7 is equal to width 4. In some further embodiments, width W7 is smaller than width W4. In some embodiments, width W8 is larger than width W4. In some other embodiments, width W8 is equal to width W4. In some further embodiments, width W8 is smaller than width W4. A difference between width W8 and width W4 is width W84. Width W84 is measuring how much lateral side S50 of silicide layer 50 is tapered.

Barrier layer 51 includes a lower portion L2 in contact with top portion 502. Lower portion L2 includes a thickness TH2. In some embodiments, thickness TH2 is substantially smaller than TH1 such that a ratio between thickness TH1 and thickness TH2 is substantially larger than 1. Barrier layer 51 includes lateral portion P2. Lateral portion P2 includes a width W22. Width W22 is substantially smaller than Width W4. In some embodiments, width W22 is substantially equals to thickness TH2.

Conductive material 52 is disposed conformally inside barrier layer 51. Conductive material 52 is bordered with lateral portion P2 and lower portion L2. Conductive material 52 includes a height H9. In some embodiments, height H9 is substantially larger than thickness TH1. A top of conductive material 52 includes a width W3. In some embodiments, height H9 is substantially larger than width W3 such that contact plug 53 includes a high aspect ratio. In some embodiments, width W3 is larger than width W8. In some other embodiments, width W3 is equal to width 8. In some further embodiments, width W3 is smaller than width W8.

Figure 5:
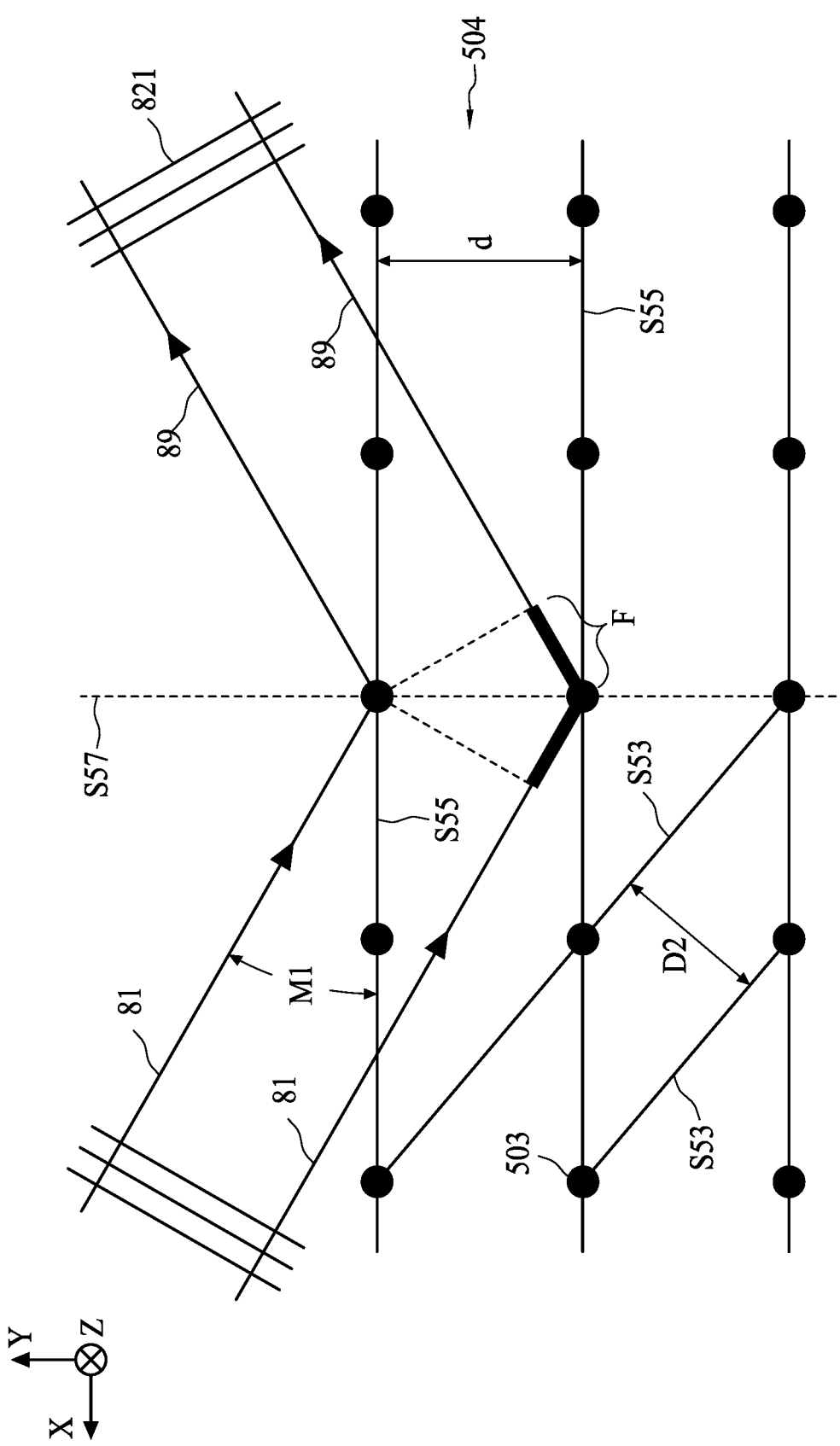
FIG. 5 is a cross-sectional view of an atomic structure, in accordance with some embodiments.

FIG. 5 illustrates a lattice structure under X-ray crystallography. X-ray crystallography is used for identifying lattice structures similar to atomic structure 504 of a crystal, in which electrons of atoms 503 cause a beam of incident rays 81 to diffract into many specific directions. Incident ray 81 and diffracted ray 89 are symmetric about a plane S57. Incident rays 81 are incident on plane S55. By measuring angles in degree M1 and intensities of these diffracted rays 89, a density of electrons within the crystal is known. From the electron density, a mean distance of separation d between planes S55 of the atoms in the crystal is determined.

Incident ray 81 and diffracted ray 89 includes a predetermined wavelength. The incident rays 81 (coming from upper left) causes each scatterer such as atoms 503 to re-radiate a small portion of its intensity as a wave 821. Diffracted rays 89 are offset from each other by a difference F. Difference F is derived from a function: $F=2\ d\ \sin(M1)$. For scatterers arranged symmetrically about plane S57 and with a separation d between each plane S55, waves 821 is in sync (add constructively) in a direction where difference F equals to an integer multiple of the predetermined wavelength. When in sync, intensity of wave 821 produces a peak in a diffraction pattern. Atomic structure 504 includes other planes such as plane S53. In some embodiments, plane S53 is a {110} plane with separation D2 between planes S53. In some embodiments, different planes with different length of separations produce different peaks in the diffraction pattern.

X-ray crystallography is related to several other methods for determining atomic structures 504. Similar diffraction patterns are produced by scattering other wavelength of light, electrons, or neutrons. To produce the diffraction pattern, the separation d between the scatterers and the wavelength of an impinging wave such as incident ray 81 are similar in size.

Figure 6:
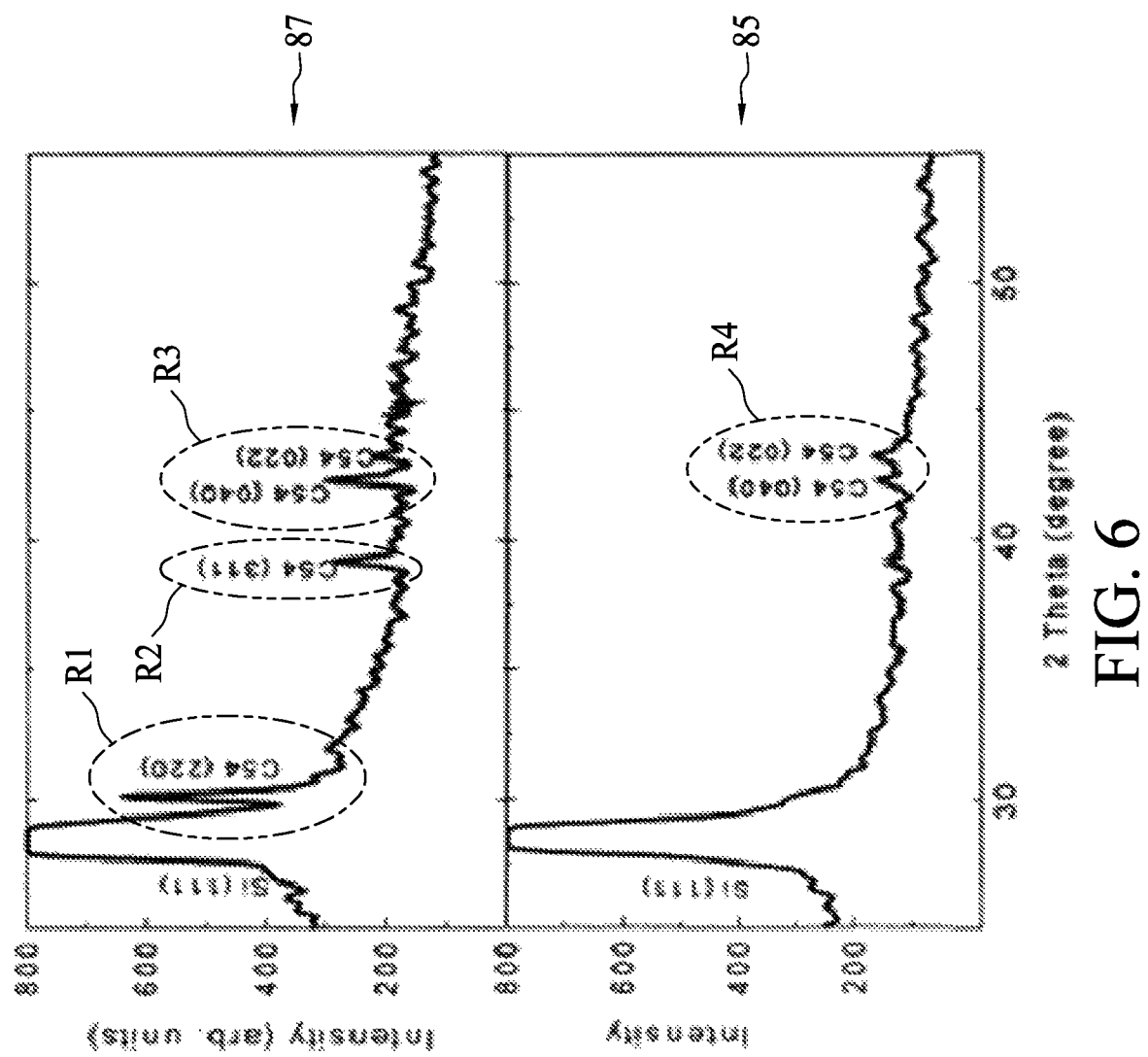
FIG. 6 is diffraction patterns of atomic structures, in accordance with some embodiments.

In FIG. 6, diffraction patterns 87 and 85 are illustrated. A horizontal axis corresponds to a degree similar to degree M1 in FIG. 5. A vertical axis corresponds to an intensity of diffracted light waves similar to wave 821 in FIG. 5. Diffraction is used as an analytical technique to characterize compounds or elements in silicide layer 50 in FIG. 4, FIG. 3, or FIG. 2.

Different thickness TH1 of silicide layer 50 in FIG. 4, FIG. 3, or FIG. 2 are analyzed by diffraction techniques and compared to one another to determine different properties in different thickness of silicide layer 50. For example, silicide layer 50 including predetermined thickness TH1 proximately in the thickness range from about 600 angstroms to about 1200 angstroms produces diffraction pattern 87. Silicide layer 50 including predetermined thickness TH1 proximately smaller than the thickness range produces diffraction pattern 85. Diffraction pattern 87 includes regions R1, R2, and R3. Region R1 includes a peak corresponds to a {220} plane in a lattice structure of silicide layer 50 in FIG. 4, FIG. 3, or FIG. 2. Region R2 includes a peak corresponds to a {311} plane in the lattice structure. Region R3 includes peaks corresponds to a {040} plane and a {022} plane. Silicide layer 50 includes a lattice structure with the {220} plane or the {311} plane measured with peaks on X-ray diffraction pattern 87 of the lattice structure. Diffraction patterns 87 and 85 of different thickness are different in regions R1, R2, and R3. In some embodiments, region R4 includes minor peaks correspond to the {040} plane and the {022} plane. However, those minor peaks are substantially smaller in intensity compare with peaks in region R3.

Figure 7:
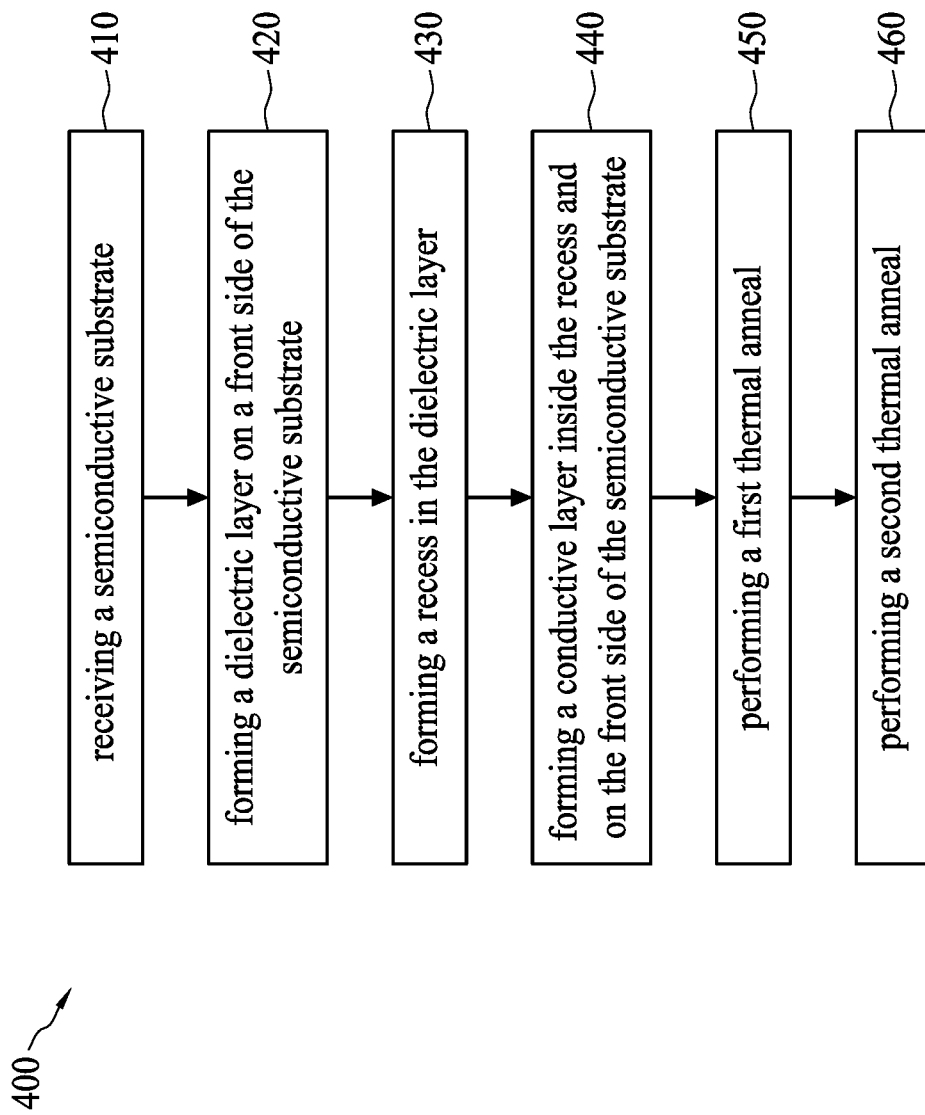
FIG. 7 is an operational flow of a method for manufacturing an image sensor, in accordance with some embodiments.
Figure 9:
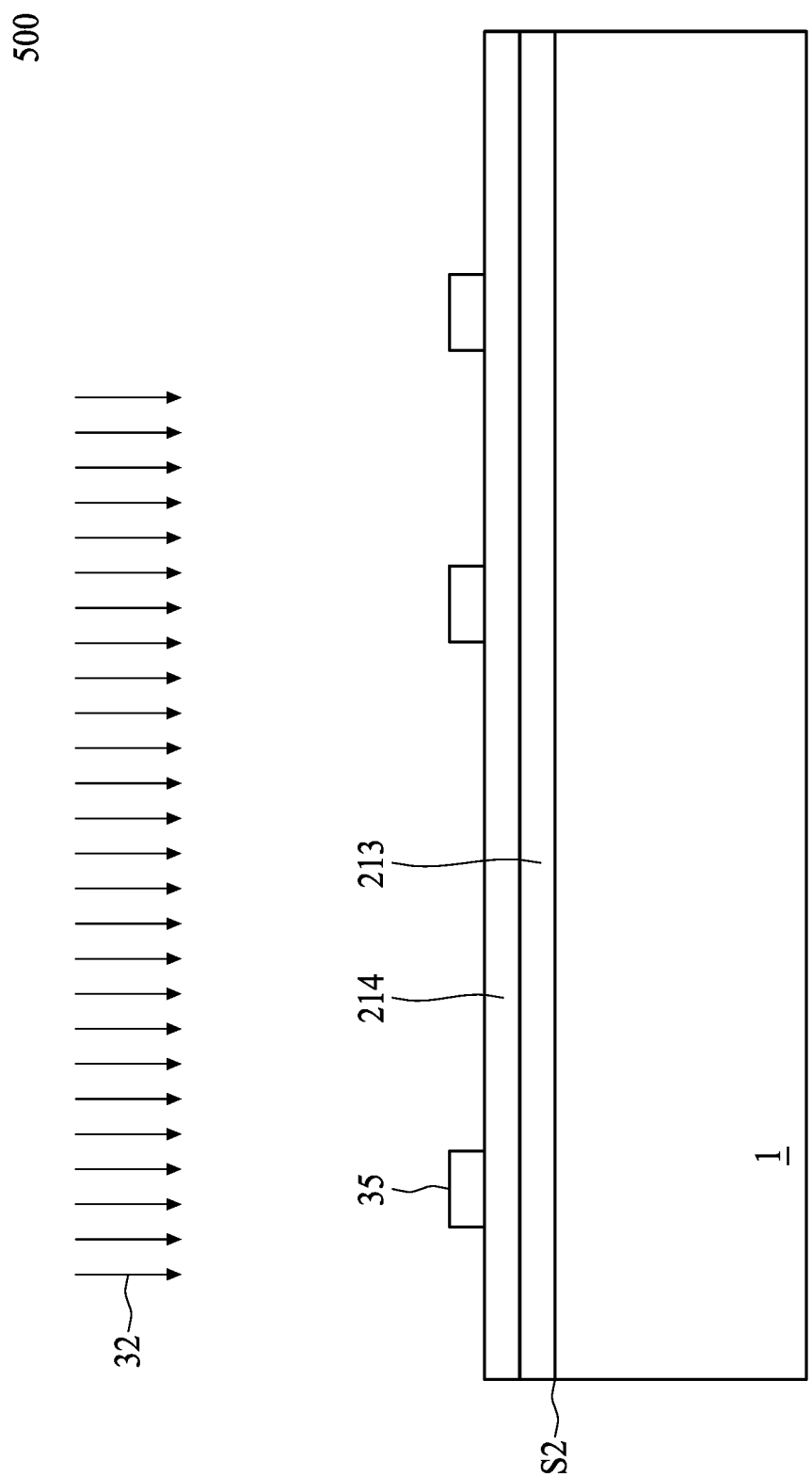
FIGS. 9 to 12 and 14 to 25 are cross sectional views of an operation in a method for manufacturing an image sensor, in accordance with some embodiments.
Figure 10:
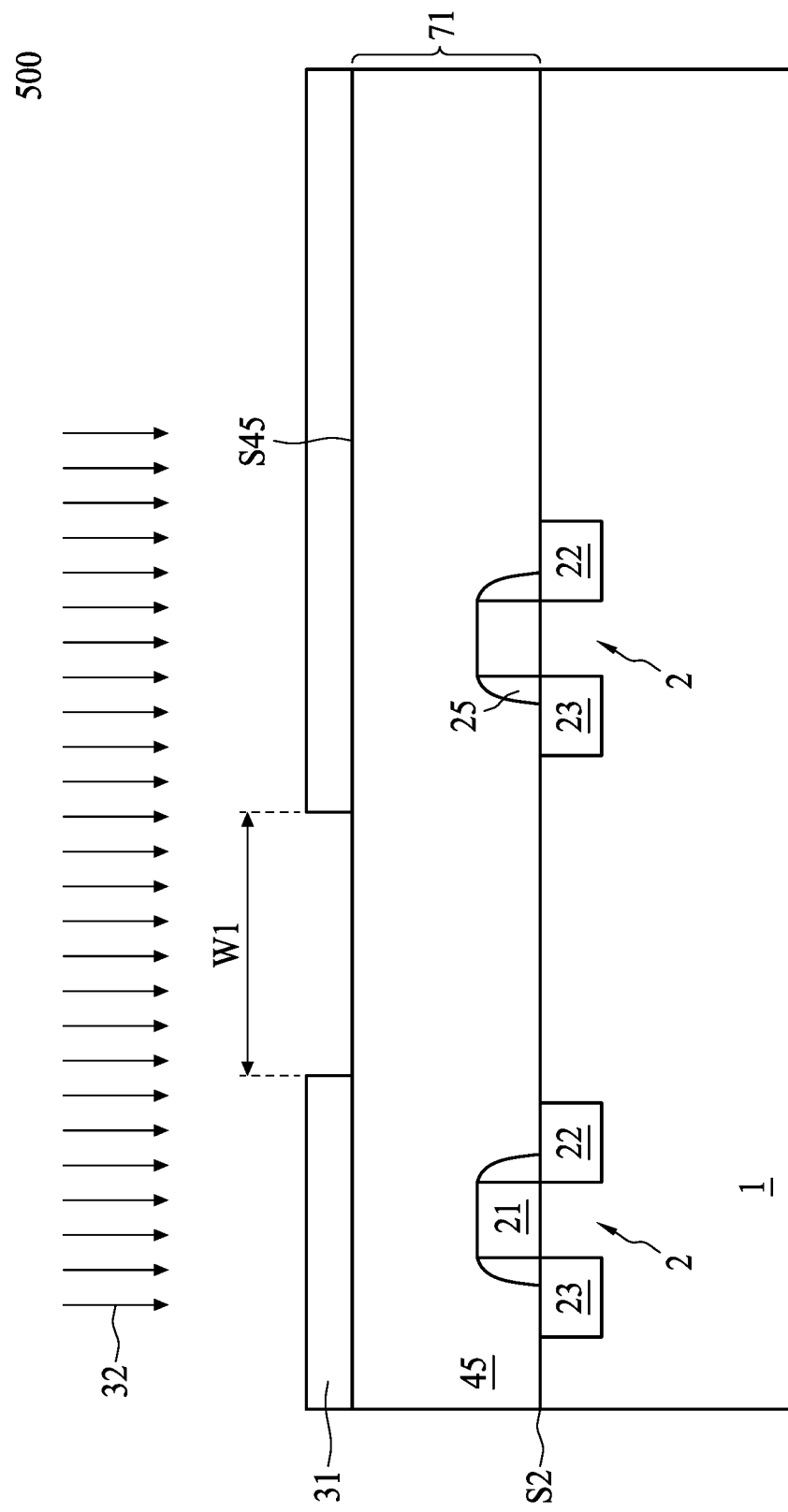
Figure 11:
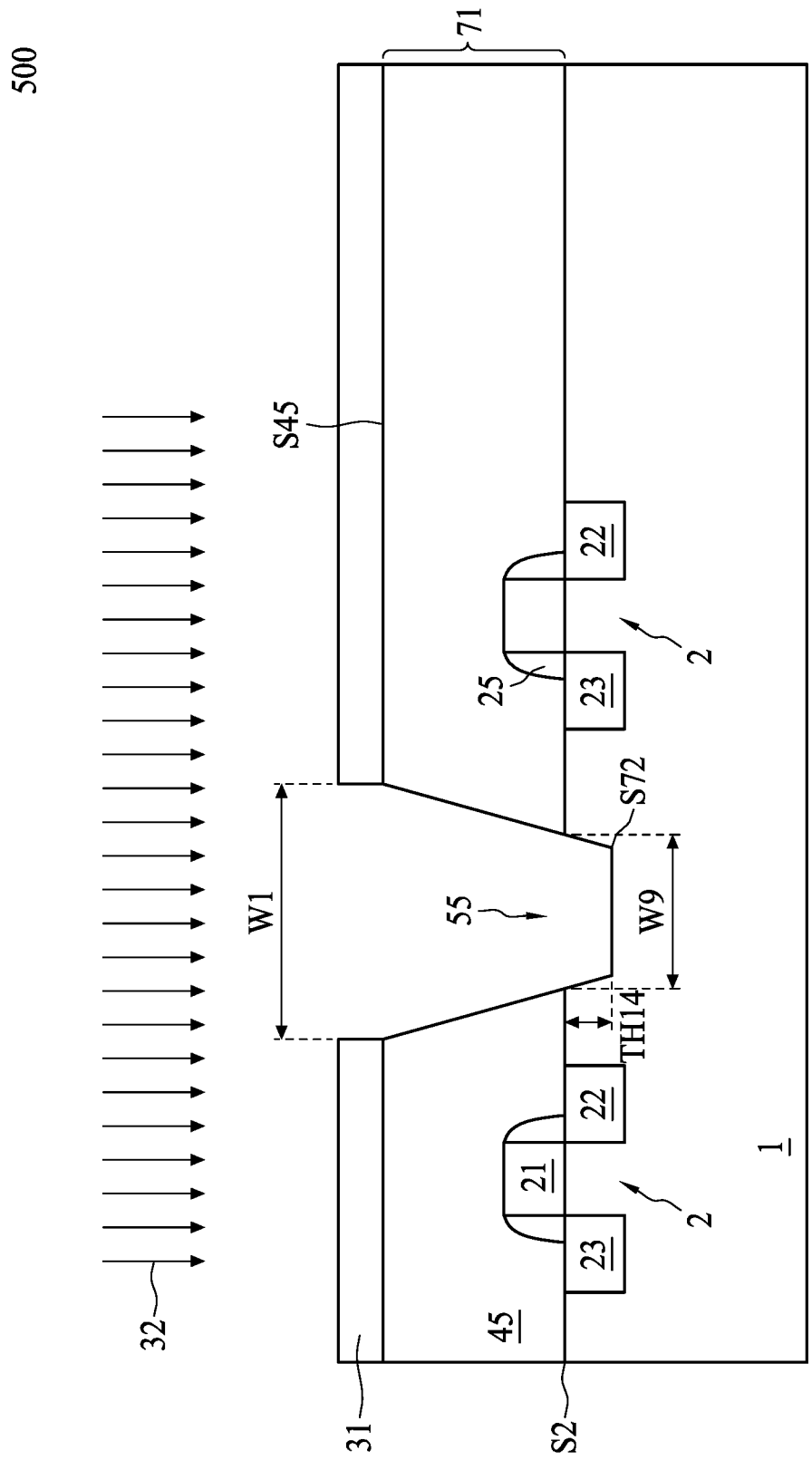
Figure 12:
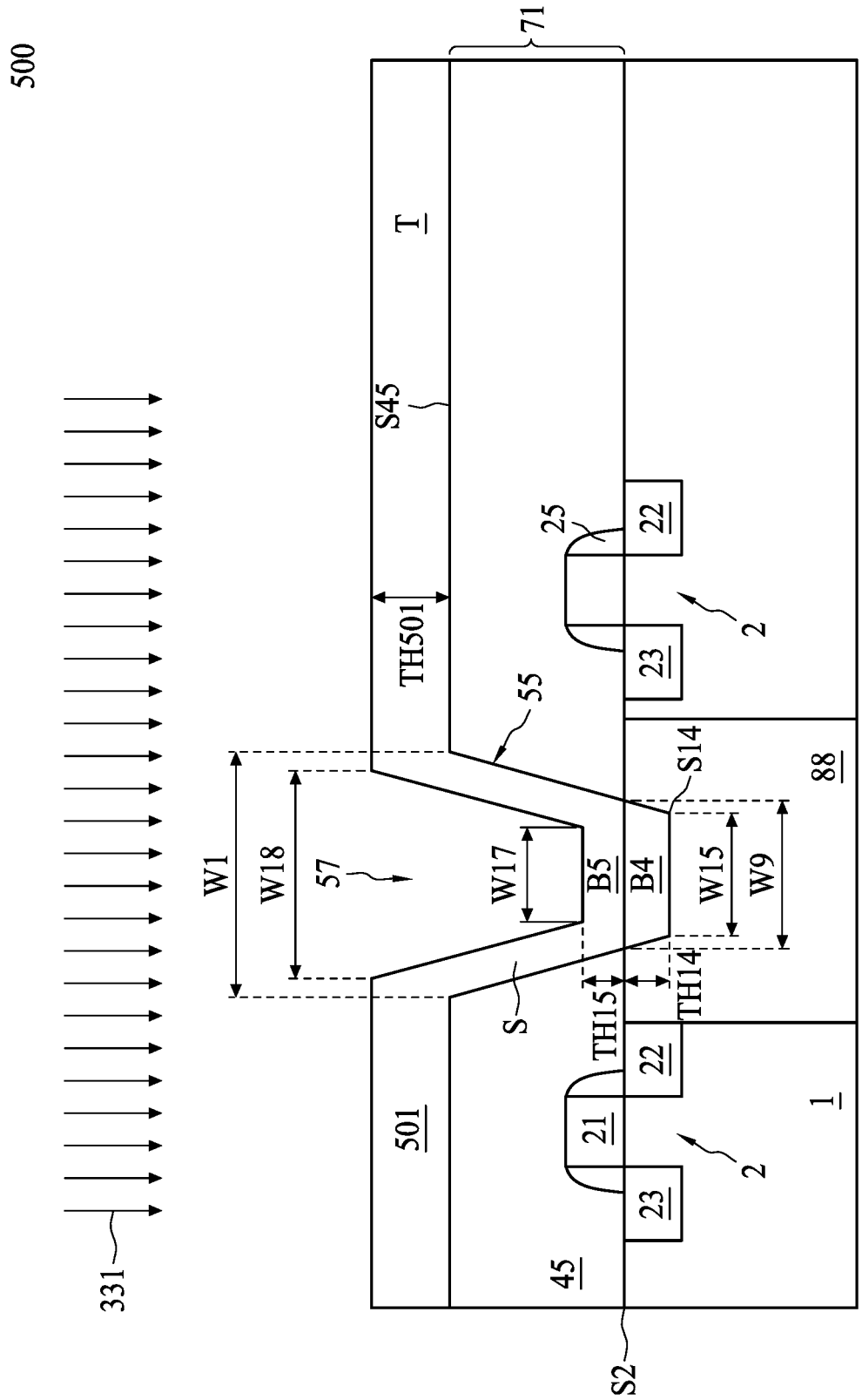
Figure 13:
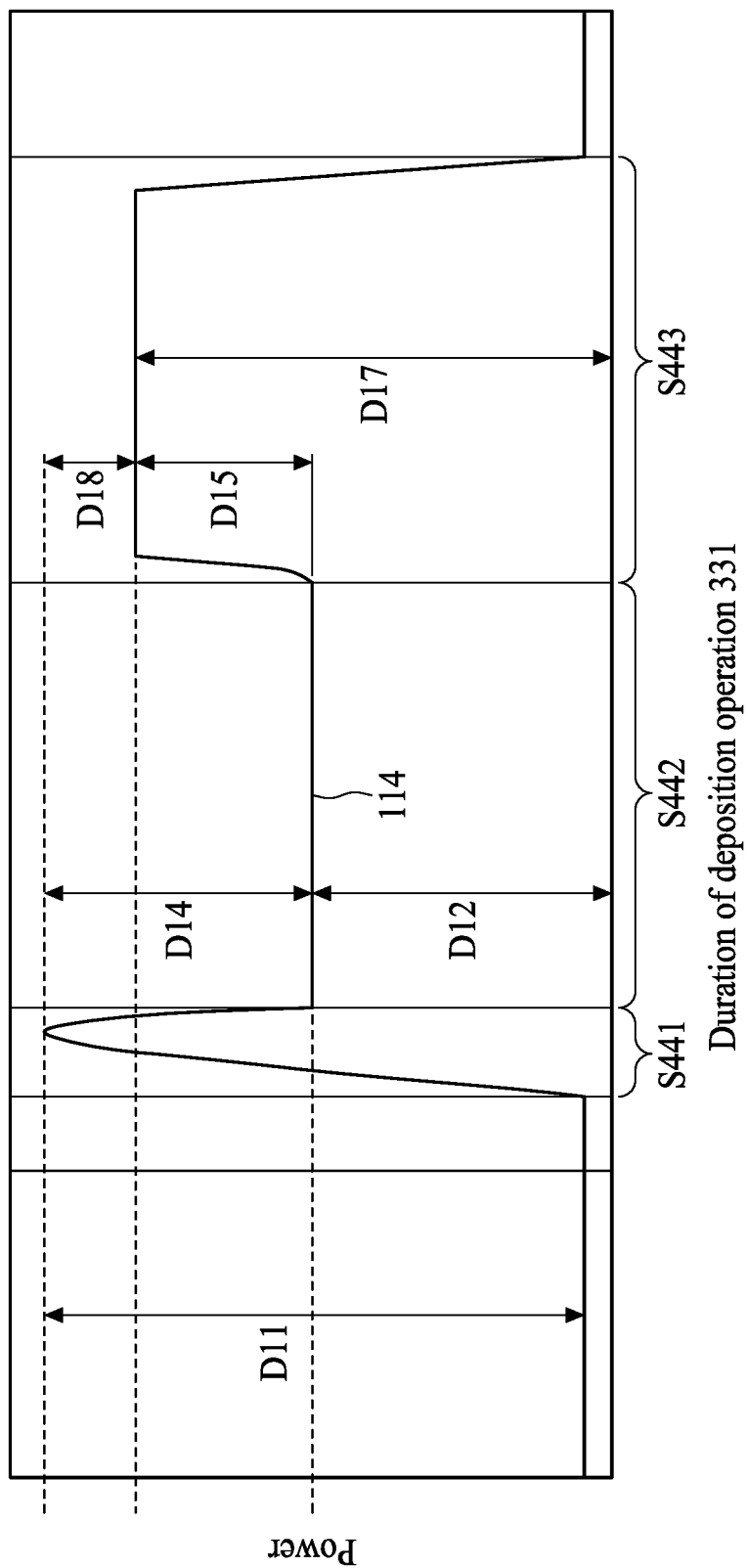
FIG. 13 is a diagram of an operation in a method for manufacturing an image sensor, in accordance with some embodiments.
Figure 14:
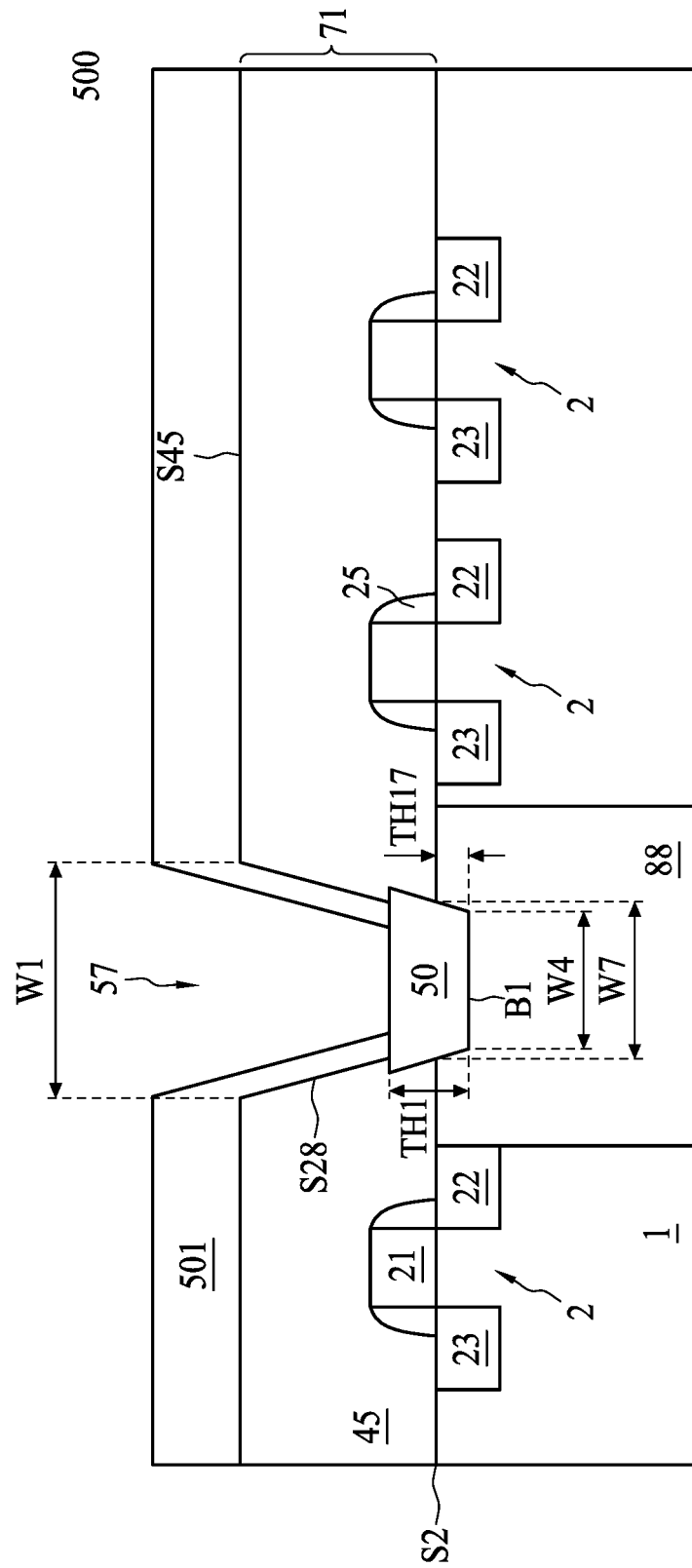
Figure 15:
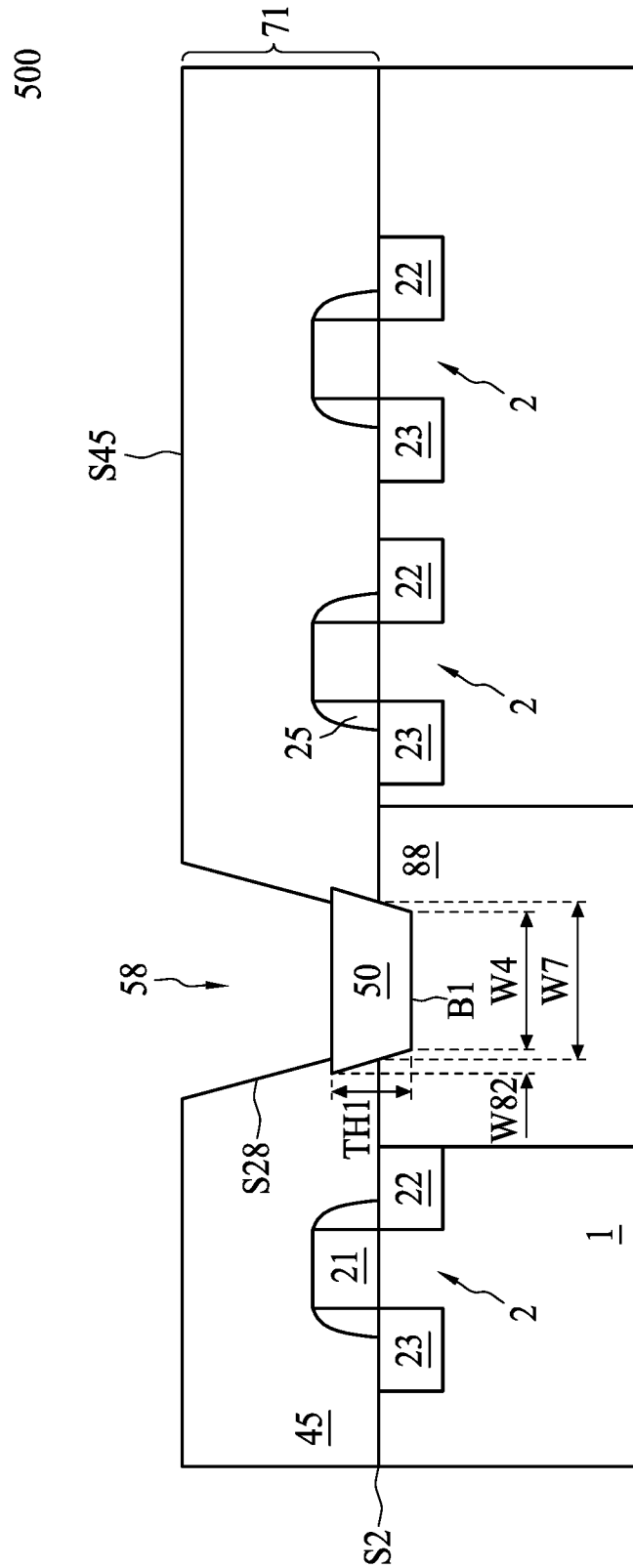

In FIG. 7, a method of manufacturing 400 is illustrated. FIG. 7 illustrates a process flow for forming the image sensor 100, 200, or 300 in FIG. 2, 3, or 4. Operation 410 receives a semiconductive substrate 1. Some exemplary embodiments for operation 410 are illustrated in FIG. 9. Operation 420 forms a dielectric layer 45 on a front side S2 of the semiconductive substrate 1. Some exemplary embodiments for operation 420 are illustrated in FIG. 10. Operation 430 forms a recess 55 in the dielectric layer 45. Some exemplary embodiments for operation 430 are illustrated in FIG. 11. Operation 440 forms a conductive layer 501 inside the recess 55 and on the front side S2 of the semiconductive substrate 1. In some embodiments, the conductive layer 501 is a titanium layer 501. Some exemplary embodiments for operation 440 are illustrated in FIGS. 12 and 13. Operation 450 performs a first thermal anneal. Some exemplary embodiments for operation 450 are illustrated in FIG. 14. Operation 460 performs a second thermal anneal. Some exemplary embodiments for operation 460 are illustrated in FIG. 15.

Figure 8:
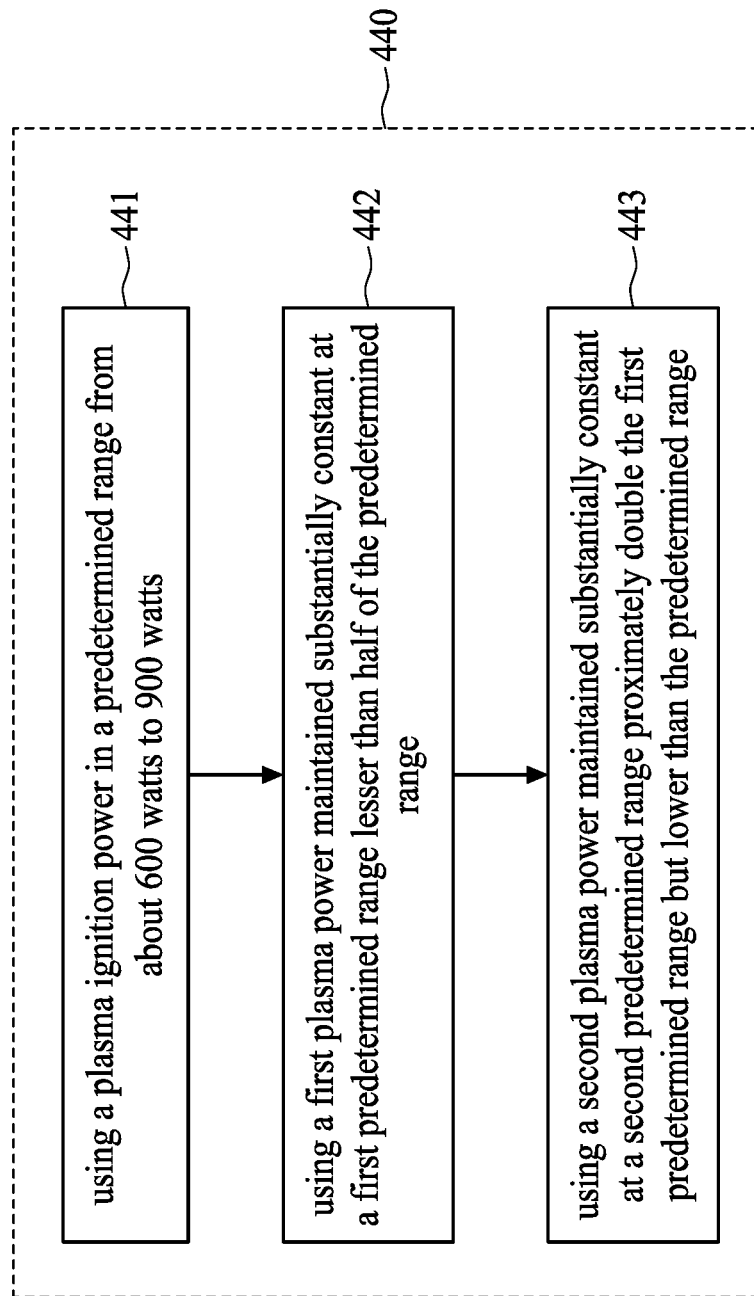
FIG. 8 is an operational flow of a method for manufacturing an image sensor, in accordance with some embodiments.

In FIG. 8, operation 440 in method of manufacturing 400 in FIG. 7 is expanded to include operations 441, 442, and 443. Operation 441 uses a plasma ignition power in a predetermined range D11 from about 600 watts to 900 watts to form a conductive layer 501 inside the recess 55 and on the front side S2 of the semiconductive substrate 1. Operation 442 uses a first plasma power maintained substantially constant at a first predetermined range D12 lesser than half of the predetermined range D11 to form a conductive layer 501 inside the recess 55 and on the front side S2 of the semiconductive substrate 1. Operation 442 uses a second plasma power maintained substantially constant at a second predetermined range D17 proximately double the first predetermined range D12 but lower than the predetermined range D11 to form a conductive layer 501 inside the recess 55 and on the front side S2 of the semiconductive substrate 1. Some exemplary embodiments for operations 441, 442, and 443 are illustrated in FIG. 13.

In FIG. 9, the semiconductive substrate 1 is received. In some embodiments, semiconductive substrate 1 includes an isolation region (not shown) formed by etching a trench in the semiconductive substrate 1 on the front side S2 and filling the trench with insulator materials such as silicon oxide, silicon nitride, or silicon oxynitride.

A gate dielectric layer 213 is covering over the semiconductive substrate 1. A gate electrode layer 214 is formed on top of gate dielectric layer 213 by any suitable deposition.

The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure chemical vapor deposition (LPCVD) process, thermal oxidation, UV-ozone oxidation, epitaxial growth methods (e.g., selective epitaxy growth), sputtering, plating, spin-on coating, other suitable methods, and/or combinations thereof. The gate electrode layer 214 is deposited above the front side S2 of the semiconductive substrate 1.

The gate dielectric layer 213 and the gate electrode layer 214 are patterned by a photolithographic process. In the photolithographic process, a layer of resist 35 is formed on top of gate electrode layer 214 and patterned to form a resist feature by a photolithography patterning method. The resist feature can then be transferred by an etching process 32 to some underlying layers (i.e., gate electrode layer 214 or gate dielectric layer 213).

The etching process 32 is any suitable etching process such as dry etching, wet etching, reactive ion etching (RIE), and/or other etching methods. The etching process 32 is either purely chemical (plasma etching), purely physical (ion milling), and/or combinations thereof.

The resist feature is transferred to gate dielectric layer 213 and gate electrode layer 214 to form gate structure 21 on a front side S2 of the semiconductive substrate 1 in FIG. 10. Gate spacer 25 is formed using any suitable process, including some processes described herein.

In FIG. 10, transistor 2 is formed coupling to photosensitive element 22 or 23 at front side S2 of the semiconductive substrate 1. In some embodiments, photosensitive element 22 or 23 is a source or a drain region formed by ion implantation or epitaxially growth.

In FIG. 10, the dielectric layer 45 is covering over the semiconductive substrate 1 by any suitable process such as the deposition process. Dielectric layer 45 is formed on front side S2 of the semiconductive substrate 1. The dielectric layer 45 is in contact with front side S2 and gate structure 21. A resist 31 is formed on top of surface S45 of the dielectric layer 45. Some etching process 32 is performed to transfer a patterned resist feature to the dielectric layer 45. The resist features includes openings with width W1.

In FIG. 11, the patterned resist feature is transferred to dielectric layer 45 to form recess 55. In some embodiments, the recesses 55 are formed by any suitable etching process such as the selective etching, the dry etching, and/or combination thereof. The selective etching uses some fluorine-containing gas, HBr and/or Cl2 as etch gases. In some embodiments, the selective etching includes a faster etching rate for materials in dielectric layer 45 than for materials in semiconductive substrate 1. Different etchant can be used for etching different compositions of materials.

Recess 55 is formed such that surface S72 of semiconductive substrate 1 is exposed near a bottom of recess 55. In some embodiments, surface S72 is below front side S2 by a depth similar to thickness TH14. Surface S72 includes a width W9. In some embodiments, a size of surface S72 is smaller than a size of surface S7 in FIG. 4. Width W9 is smaller than width W7 in FIG. 4. A top of recess 55 includes a width W11. Width W11 is substantially the same as width W1 of contact plug 53 in FIG. 3. Width W11 is measured along surface S45. After the recess 55 is formed resist 31 is removed.

In FIG. 12, conductive layer 501 is formed on top of dielectric layer 45 and covered over recess 55. A top portion T of conductive layer 501 is over surface S45 of dielectric layer 45. Conductive layer 501 is conformally formed over recess 55 such that recess 57 is formed following a contour of recess 55. Lateral side S of conductive layer 501 is lined to a lateral side of recess 55. In some embodiments, recess 57 is aligned vertically over recess 55.

In some embodiments, bottom portion B5 or B4 of conductive layer 501 is formed near front side S2. Bottom portion B5 is over front side S2. Bottom portion B4 is under front side S2. Bottom portion B5 of conductive layer 501 includes a thickness TH501 measured vertically in a direction orthogonal to front side S2. Bottom portion B4 of conductive layer 501 includes a thickness TH14 measured vertically in a direction orthogonal to front side S2. Thickness TH14 is measured from front side S2 to surface S14. Bottom portion B4 includes a surface S14 in contact with non-salicide region 88. Bottom portion B4 is buried inside non-salicide region 88. Surface S14 includes a width W15. In some embodiments, width W15 is different from width W4 in FIG. 4. In some embodiments, bottom portion B4 is substantially a thin film such that thickness TH14 is smaller than thickness TH15. A bottom of recess 57 exposes a top side of bottom portion B5. The top side is exposed and includes a width W17. A top of recess 57 includes a width W18. Width W17 is smaller than width W18.

In some embodiments, thickness TH14 is substantially larger than thickness TH15. An interface is between bottom portion B5 and bottom portion B4. The interface includes a width W9 measured in a direction along front side S2. In some embodiments, width W9 is larger than width W15. In some other embodiments, width W9 is equal to width 15. In some further embodiments, width W9 is smaller than width W15. In some embodiments, width W17 is smaller than or equal to width W18. In some embodiments, width W17 is equal to width W9. In some further embodiments, width W17 is equal to width W15.

Conductive layer 501 is formed by any suitable method such as deposition operation 331 or epitaxial growth. The deposition operation 331 includes any suitable operation such as sputtering deposition, physical vapor deposition (PVD), high density plasma CVD (HDPCVD), remote plasma CVD (RPCVD), plasma enhanced CVD (PECVD), sputtering, other suitable methods, and/or combinations thereof.

FIG. 13 is a diagram 110 illustrated a trace 114 of a plasma power used during the deposition operation 331 to form conductive layer 501 in FIG. 12. A horizontal axis of diagram 110 represents duration of the deposition operation 331. A vertical axis of diagram 110 represents a power applied to plasma.

In some embodiments, deposition operation 331 is a PVD operation using sputtering to deposit titanium (Ti). The PVD operation includes creating plasma and using plasma to erode a target (not shown). A material in the target is hit by plasma and deposited on a wafer (not shown). In the PVD operation, a vacuum is created in a chamber (not shown) to a certain low pressure. Argon (Ar) is introduced into the chamber. The Ar is then ignited to form a plasma of Ar+ ions. In some embodiments, the target is made of titanium. During deposition, the target is biased negatively, causing positively charged Ar+ ions to bombard the target. The positively charged Ar+ ions knock target atoms from the target. The target atoms are then propelled towards the wafer. The plasma in the chamber is created by applying a voltage across the target to the plasma ignition power level. The plasma ignition power is referred to as a "break down" spike. The break down spike is associated with a creation of a plasma in the chamber (also known as "plasma ignition"). This condition creates an initial thin layer near surface S14 under front side S2 in FIG. 12. In some embodiments, the plasma ignition power is limited to predetermined range D11 such that the initial thin layer is formed to be substantially smooth.

A power of plasma is corresponded to a depth of a deposited material inside the wafer. The power of plasma is corresponded to a thickness of the deposited layer on the wafer. For example, an increased plasma power increases a depth of deposited material buried in the wafer. In some embodiments, plasma is generated in a region above the wafer and between the wafer and the target, and cause material from the target to deposit on the wafer such as on surface S45 in FIG. 12.

In diagram 110 trace 114 in stage S441 rise sharply to reach the plasma ignition power. In some embodiments, the plasma ignition power is in a predetermined range D11 from about 600 watts to 900 watts. Then trace 114 drops down by power level D14 to first predetermined range D12. First predetermined range D12 is about half of the predetermined range D11. Predetermined range D11 from about 600 watts to 900 watts is to prevent roughness the initial thin layer near surface S72 in FIG. 11. Surface S72 in FIG. 11 is deposited by any suitable deposition operation to form surface S14 in FIG. 12. A smoothness of the initial thin layer affects a conductivity of non-salicide region 88 in FIG. 12, and reduces resistance between non-salicide region 88 and bottom portion B4 in FIG. 12.

In stage 442, the PVD operation uses a first plasma power maintained substantially constant at first predetermined range D12. In some embodiments, first predetermined range D12 is lesser than half of the predetermined range D11. Stage S442 last substantially longer than stage S441.

In stage S443, the PVD operation uses a second plasma power maintained substantially constant at second predetermined range D17. In stage S443, trace 114 rises to second predetermined range D17. Second predetermined range D17 is proximately double the first predetermined range D12 but lower than the predetermined range D11. Second predetermined range D17 is lower than predetermined range D11 by a power level D18. Second predetermined range D17 is larger than first predetermined range D12 by a power level D15.

In FIG. 14, image sensor 500 is heated in a first thermal anneal such as a first rapid thermal anneal (RTA) operation. Performing the first thermal anneal causes a material, such as titanium, in bottom portion B4 or bottom portion B5 to react with non-salicide region 88 in semiconductive substrate 1 to form silicide layer 50. However, conductive layer 501 deposited on surface S45 or near lateral side S27 of recess 57 does not react to form silicide.

In some embodiments, silicide layer 50 is expanded such that a size of silicide layer 50 is larger than bottom portion B4, bottom portion B5, and/or combination thereof in FIG. 12. Width W4 is larger than width W15 in FIG. 12. Thickness TH1 is larger than thickness TH15, thickness TH14, and/or combination thereof in FIG. 12. Width W7 is larger than width W9 in FIG. 12. Silicide layer 50 includes a thickness TH17 measured from front side S2 to a bottom side B1. In some embodiments, thickness TH17 is larger than thickness TH14 in FIG. 12.

In FIG. 15, silicide layer 50 is tapered such that width W4 is smaller than a top side of silicide layer 50 by a width W8. In FIG. 15, material such as unreacted titanium in conductive layer 501 in FIG. 14 is selectively etched from the surface S45 or close to lateral side S28 of recess 58 leaving silicide layer 50 near front side S2. Removing the unreacted titanium is performed between the first thermal anneal and the second thermal anneal. The material in silicide layer 50 such as reacted titanium silicide (TiSi2) has a crystallographic structure, known as C49. C49 TiSi2 has a high sheet resistance.

In some other embodiments, the unreacted titanium is remained inside recess 58 and lined to lateral side S28. A second thermal anneal such as a second RTA is performed to cause C49 TiSi2 to change phase, forming a low resistance C54 TiSi2. C54 TiSi2 has a lower sheet resistance than C49 and is used as an effective contact material. C54 TiSi2 has a low contact resistance property. In FIG. 6, diffraction patterns 87 and 85 include planes in the lattice structure of C54 TiSi2 as shown in region R1, R2, R3, or R4. After performing the second thermal anneal, salicide layer 50 includes a lattice structure of C54 with a {220} plane, a {040} plane, a {022} plane, or a {311} plane measured with peaks on an X-ray diffraction pattern 87 of the lattice structure.

By performing the second thermal anneal, silicide layer 50 is formed including a predetermined thickness proximately in a range from about 600 angstroms to about 1200 angstroms. In some embodiments, a size of silicide layer 50 is changed by the second thermal anneal.

In some other embodiments, silicide layer 50 is planarized such that a top of silicide layer 50 is coplanar with front side S2, and thickness TH1 is measured from front side S2 to bottom side B1. In some further embodiments, the first thermal anneal or the second thermal anneal is performed in later operations such as after conductive material 52 is formed over barrier layer 51 in FIG. 17.

Figure 16:
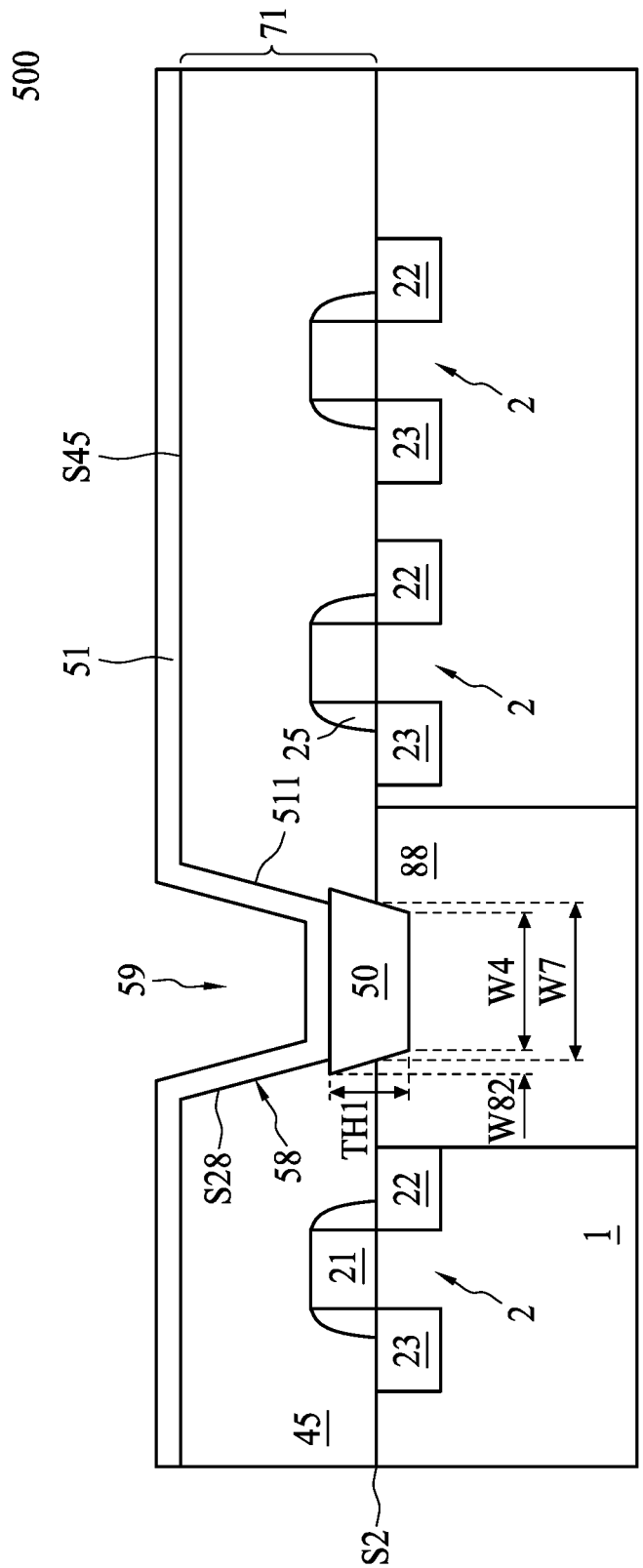

In FIG. 16, barrier layer 51 is conformally deposited covering over recess 58 and silicide layer 50. Barrier layer 51 is formed on top of surface S45 and silicide layer 50 to form recess 59 over recess 58. Barrier layer 51 is formed by any suitable method of deposition. In some embodiments, thin film 511 of unreacted metal such as titanium is remained and conformally lined to a lateral side S28 of recess 58. Barrier layer 51 is covering over thin film 511 conformally.

Figure 17:
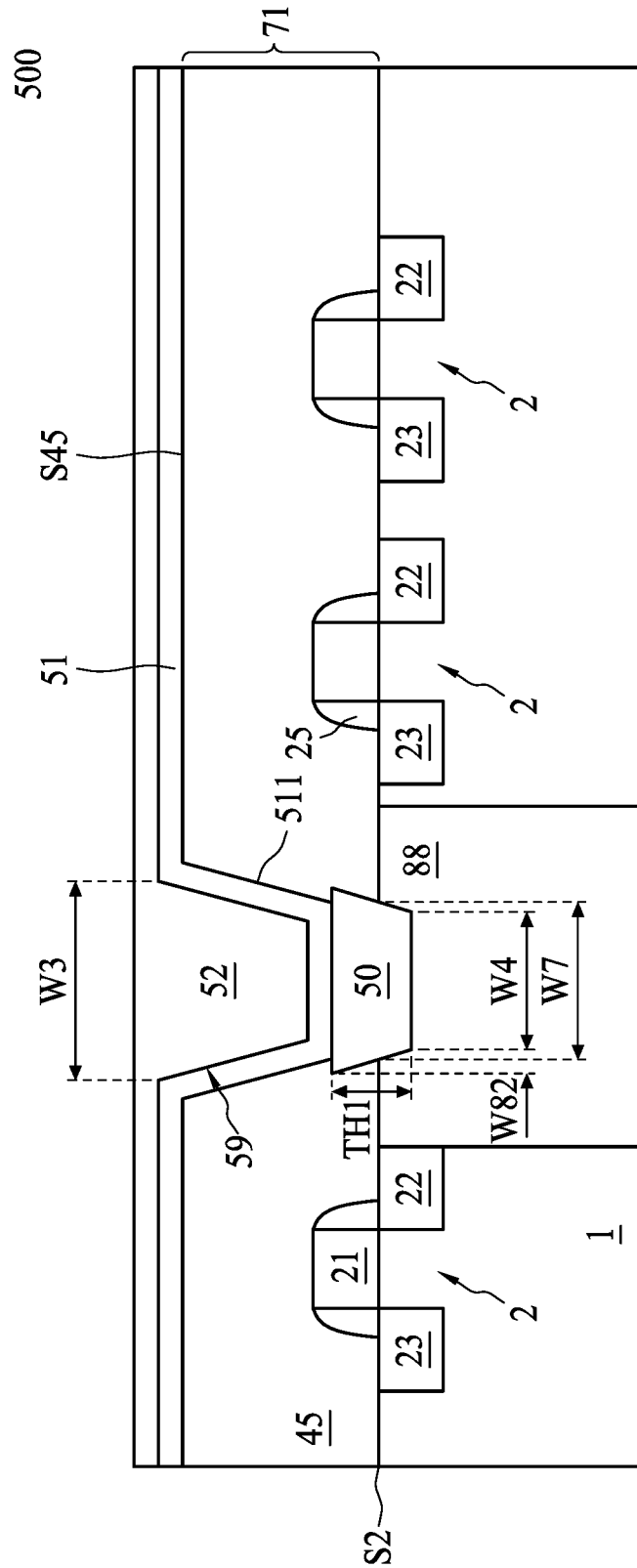

In FIG. 17, recesses 59 are filled by conductive material 52 in some suitable processes such as the deposition process. Conductive material 52 is formed on top of barrier layer 51. The process parameters include a total pressure, some reactant concentrations, a deposition temperature, or a deposition rate.

Figure 18:
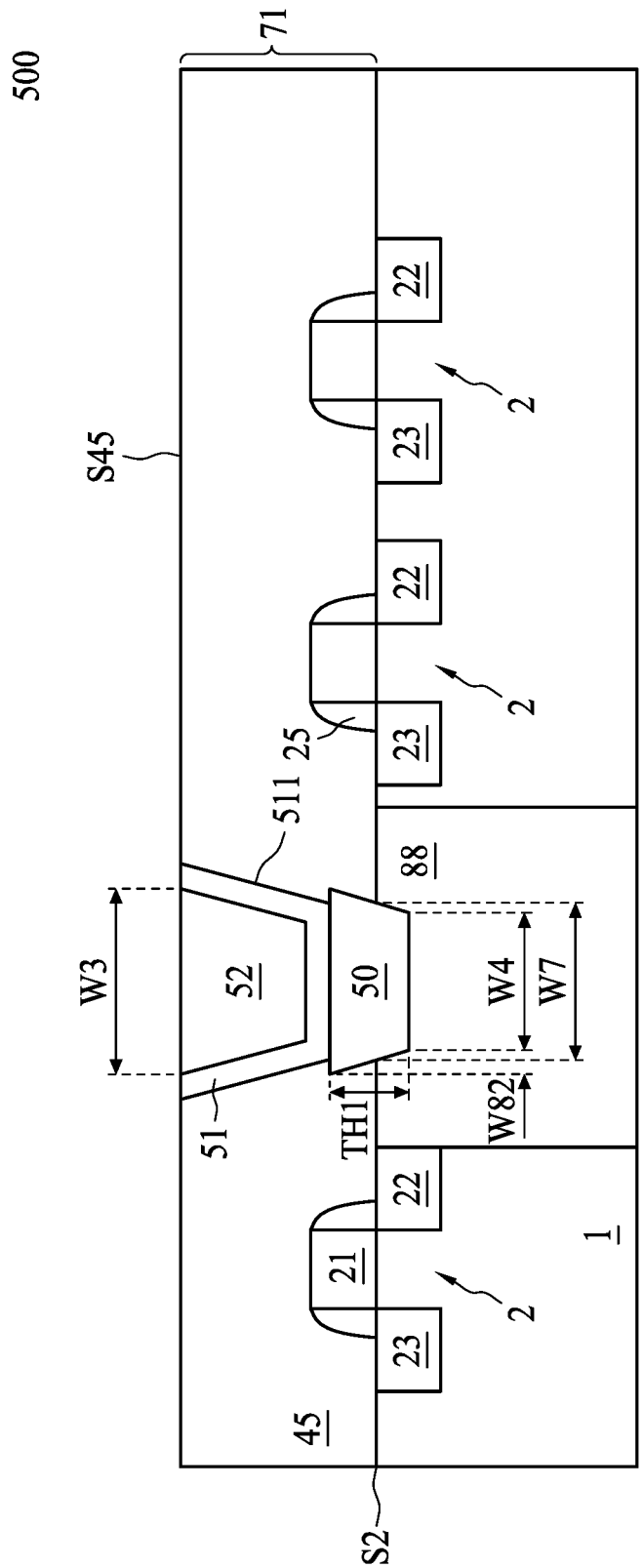

In FIG. 18, a top portion of conductive material 52 and barrier layer 51 are removed by any suitable planarization such as a chemical mechanical planarizing CMP or etching back. Planarization is performed such that surface S45 is exposed. Planarization is performed such that a top of conductive material 52 is substantially coplanar with surface S45.

Figure 19:
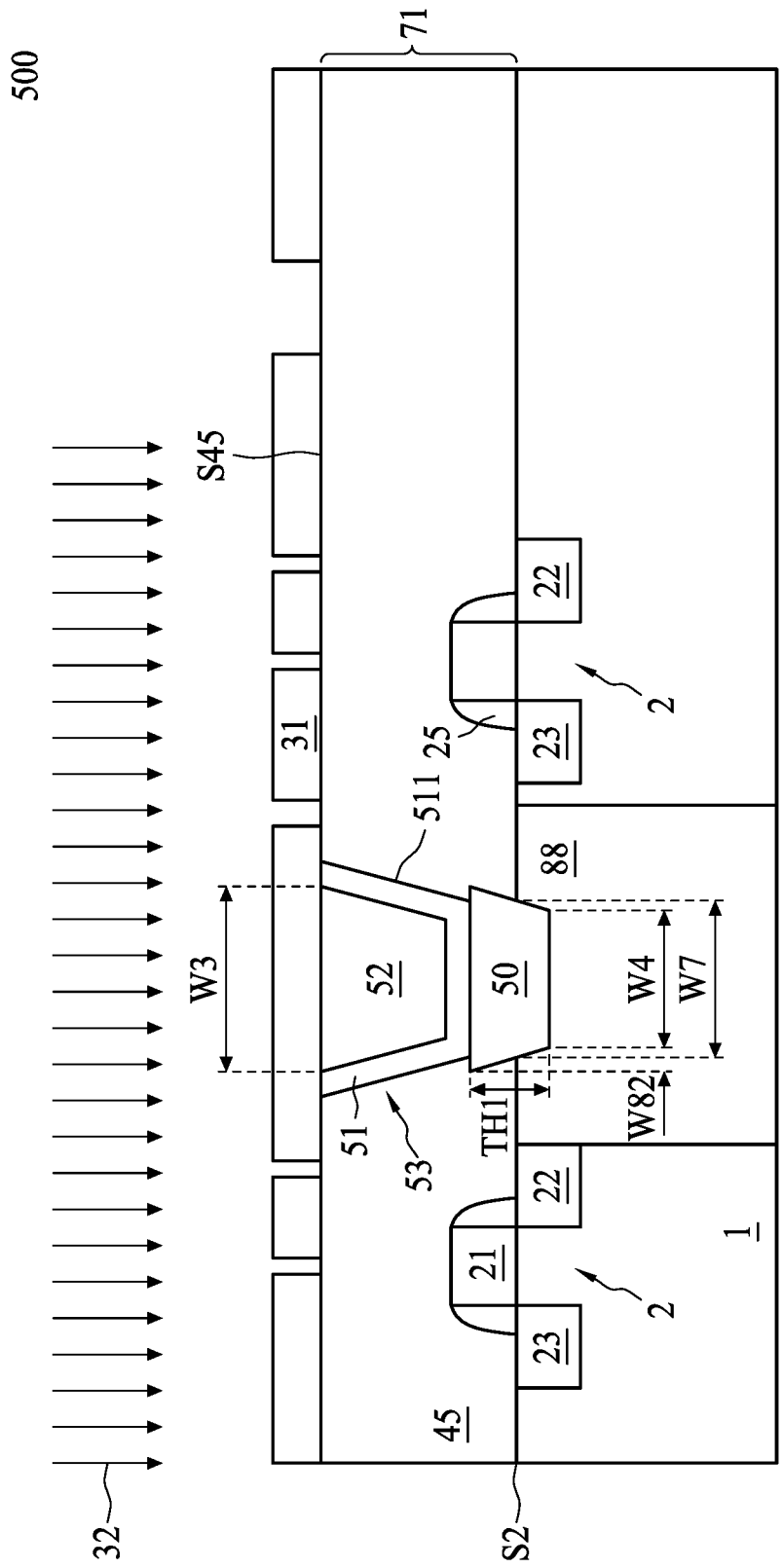
Figure 20:
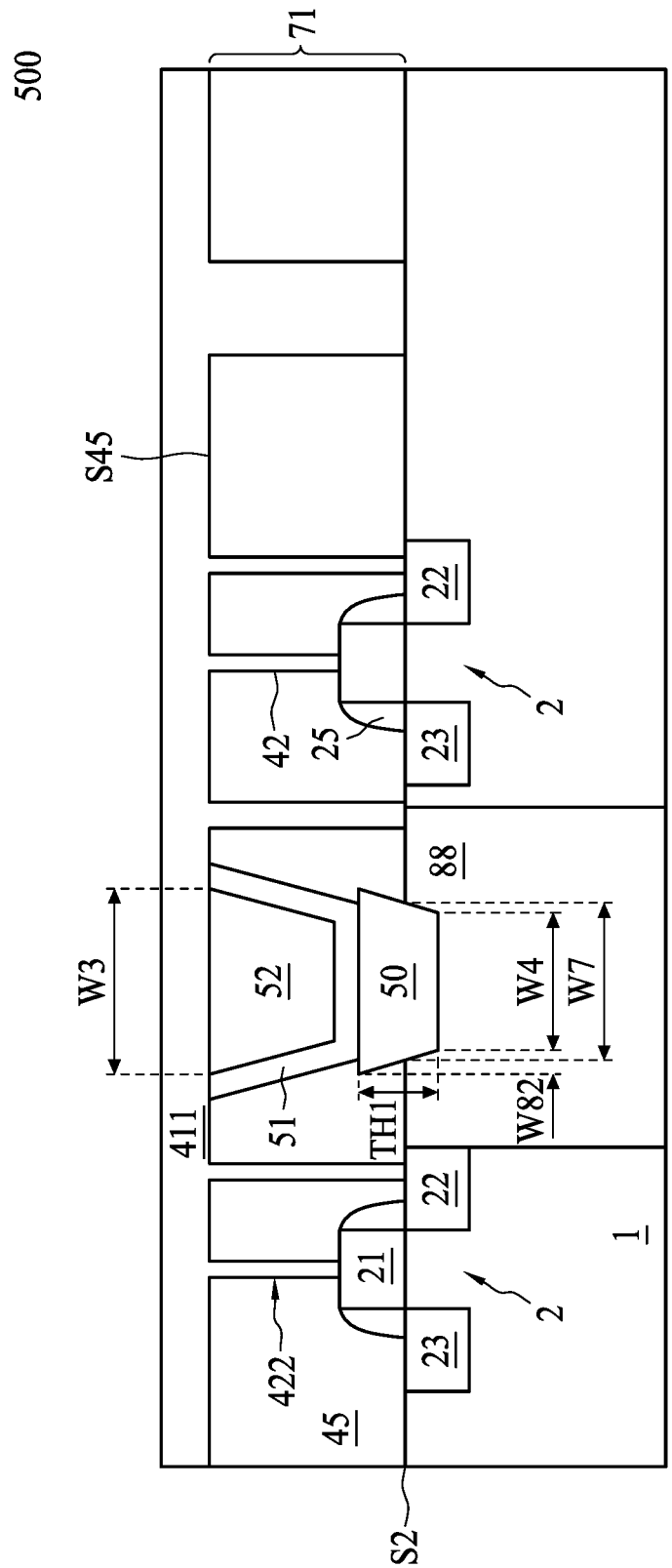

In FIG. 19, contact plug 53 is formed. In FIG. 19, resist 31 is formed on top of surface S45. The resist feature is transferred to dielectric layer 45 to form contact 42 in FIG. 20. In FIG. 20, the patterned resist feature is transferred to dielectric layer 45 to form some trenches 422. In some embodiments, the trenches 422 are formed by any suitable etching process such as the selective etching, the dry etching, and/or combination thereof. The trenches 422 are filled by some conductive materials to form contacts 42. Contacts 42 are formed by filling the trenches 422 by some suitable processes such as the deposition operation. The deposition operation covers over surface S45 to form conductive layer 411. Conductive layer 411 is formed over conductive material 52 and on top of ILD layer 71.

Figure 21:
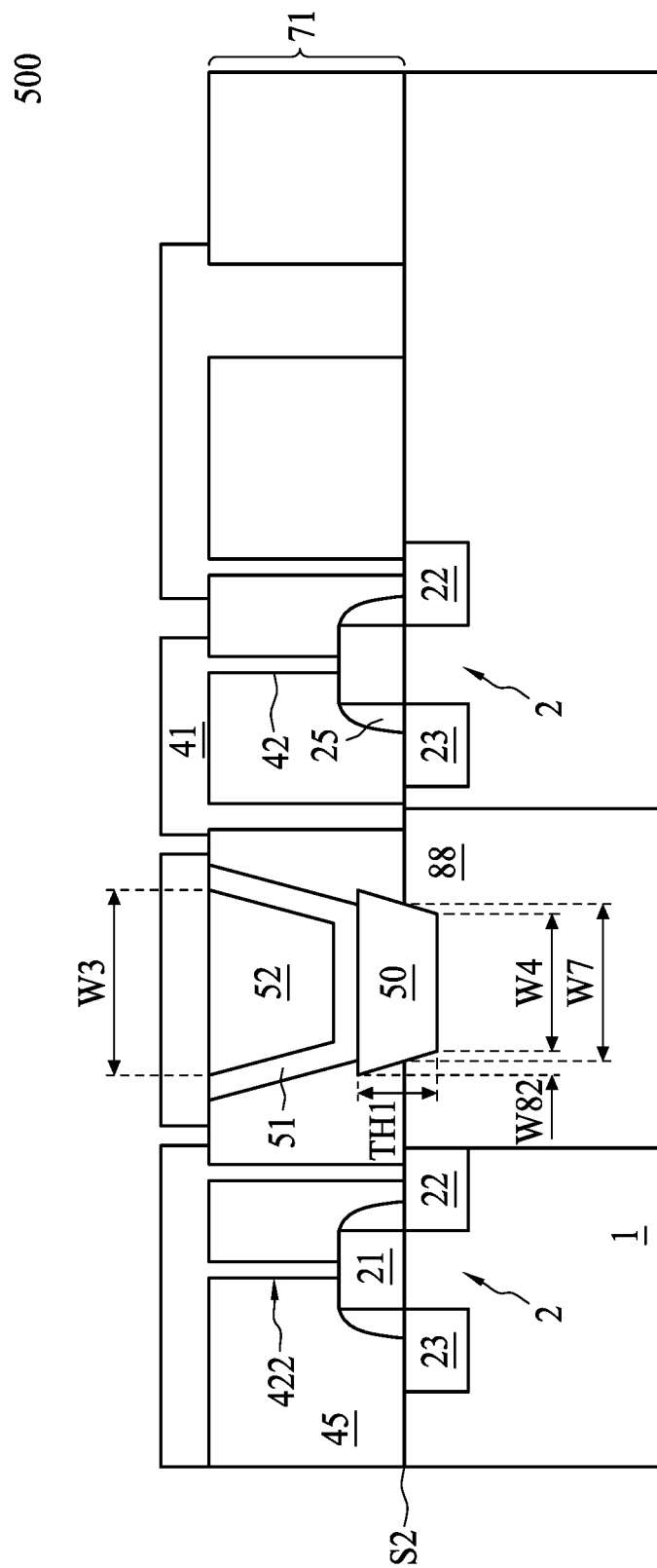

In FIG. 21, conductive layer 411 is patterned by any suitable lithographic operation to form interconnection 41. Interconnection 41 is formed on top of conductive material 52 to electrically coupled silicide layer 50 to other circuitry. Interconnection 41 is formed on top of contact 42 to electrically coupled contact 42 to other circuitry.

Figure 22:
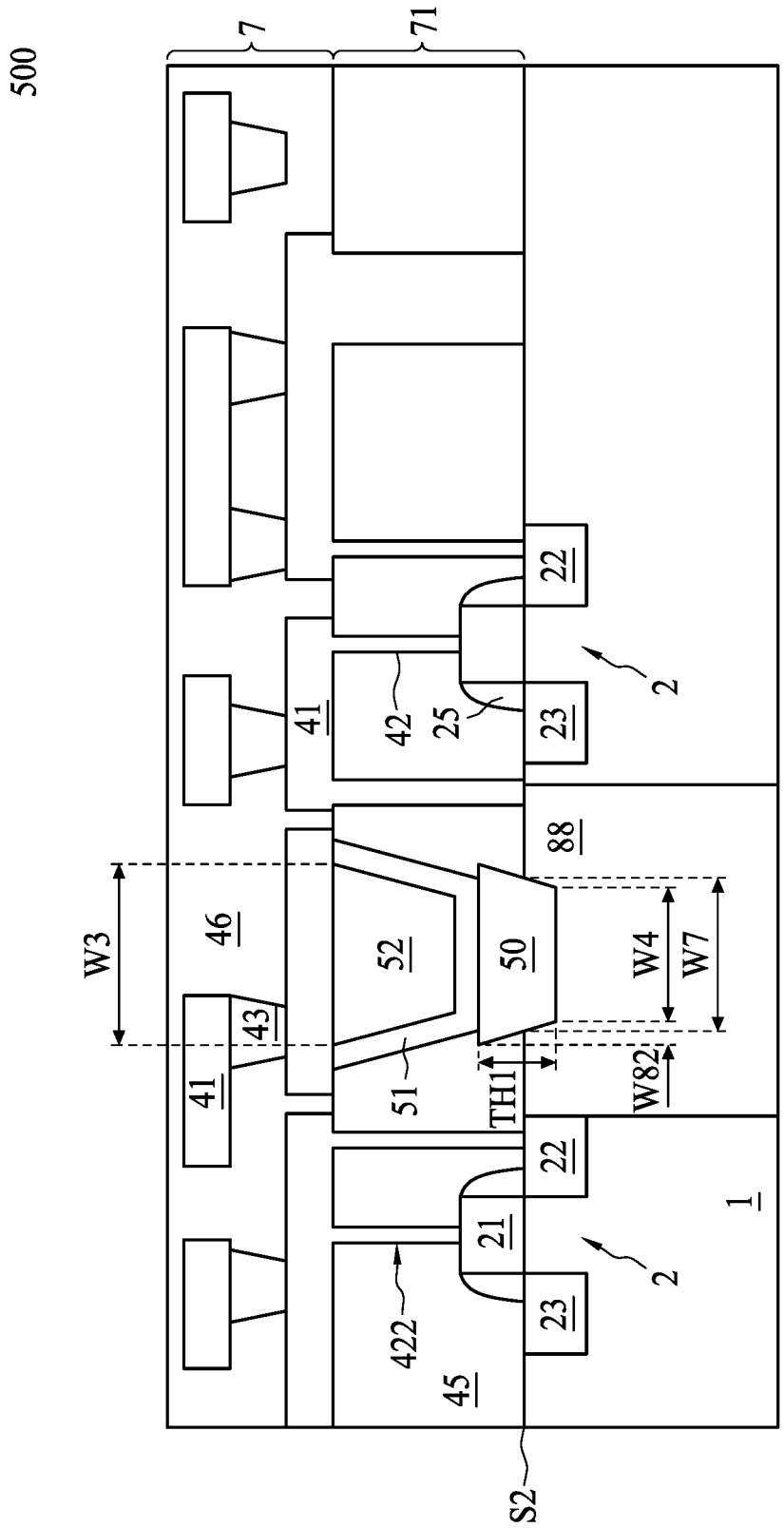

In FIG. 22, dielectric materials are covering over the interconnections 41 to form dielectric layer 46 by some suitable deposition operation. Dielectric layer 46 is patterned and etched to form recesses. The recesses are filled by conductive material to form via 43. In some embodiments, a planarization, such as chemical mechanical planarizing CMP, is used to remove some excess blanket layers of the conductive materials of via 43. Additional layer of interconnection 41 is formed in a similar fashion as a first layer of interconnection 41. In some embodiments, dielectric layer 46 is covering over the vias 43 and over interconnection 41.

Figure 23:
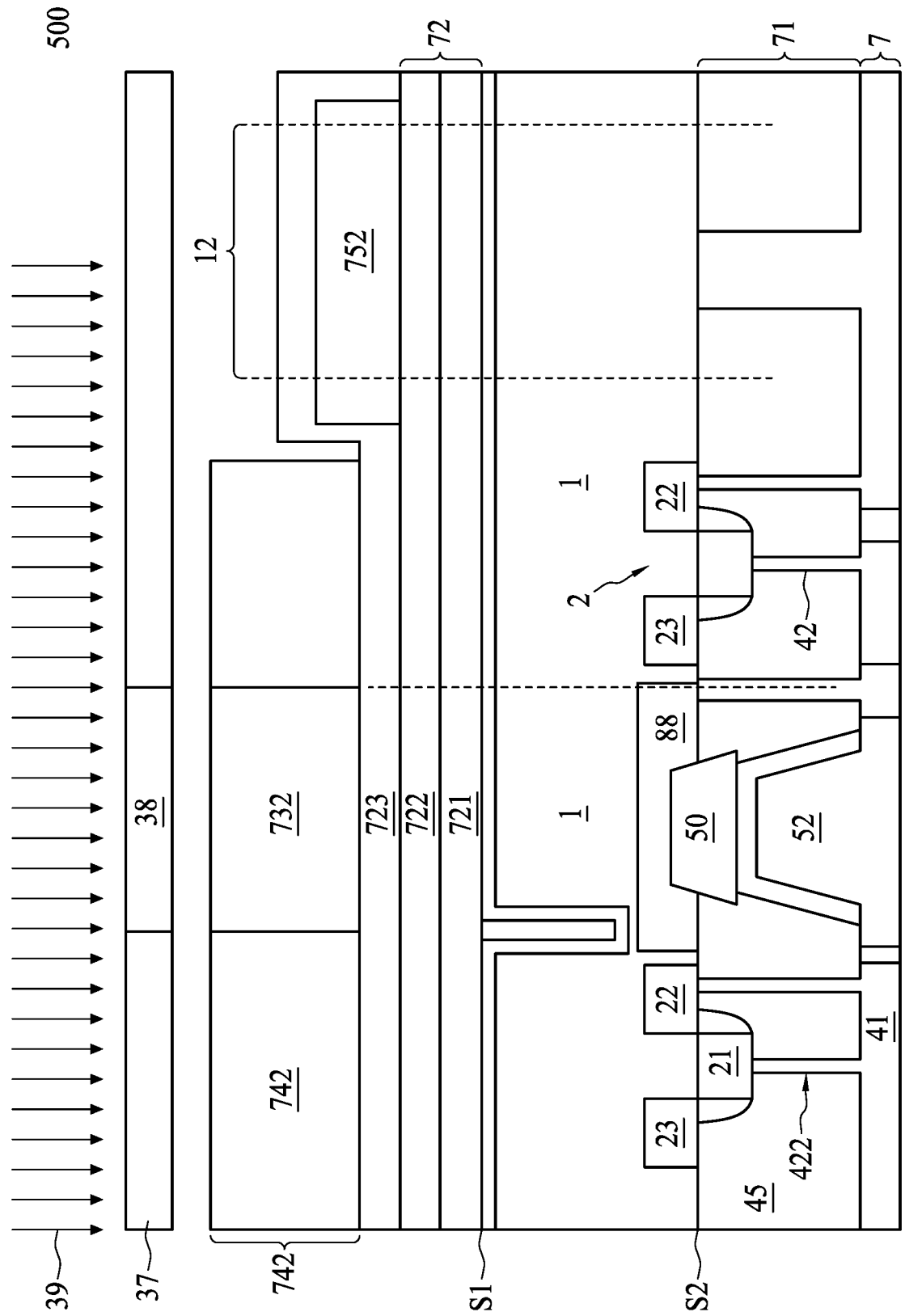

In FIG. 23, image sensor 500 is flipped upside down such that the back side S1 of the semiconductive substrate 1 is above the front side S2. Multilayer structure 72 is formed on top of the back side S. Transmitting layer 721 and second transmitting layer 722 are formed sequentially by the deposition processes such as CVD, PECVD, or other suitable methods. Light shielding layer 752 is formed on top of multilayer structure 72 by depositing and patterning light shielding layer 752. The light shielding layer 752 is formed by the deposition process including depositing a metal layer (or a layer of another opaque material) over the second transmitting layer 722. The deposited layer is etched to leave the light shielding layer 752 in a region corresponding to the black level reference pixels 19.

Black level reference pixels 19 is formed by forming the light shielding layer 752 on the second transmitting layer 722. The capping layer 723 is blanket formed over the light shielding layer 752 and the second transmitting layer 722. In some embodiments, capping layer 723 is a passivation layer.

A color resist 742 is formed over the multilayer structure 72. The color resist 742 is for allowing a light with a color red, green, or blue to pass through. The color resist 742 is formed by any suitable process such as a deposition process. The deposition process may be spin-on coating, chemical vapor deposition (CVD), physical vapor deposition (PVD), atomic layer deposition (ALD), or combination thereof.

A suitable process such as photolithography is performed on the color resist 742. In photolithography the color resist 742 is exposed through a photomask 37. A photomask 37 is patterned to include a region 38. The region 38 forms a pattern over a portion 732 of color resist 742 in pixel region 18. The photomask 37 is placed over the color resist 742 to allow ultraviolet (UV) light 39 reaching to portion 732 of the color resist 742 under the region 38. The color resist 742 is photosensitive. To make the pattern insoluble, the portion 732 is UV cured by exposure through region 38 of photomask 37. Other soluble portions of the color resist 742 are removed by a developing solution. The pattern is cured through baking. The portion 732 is hardened, insoluble and remained on top of the multilayer structure 72 after baking.

Figure 24:
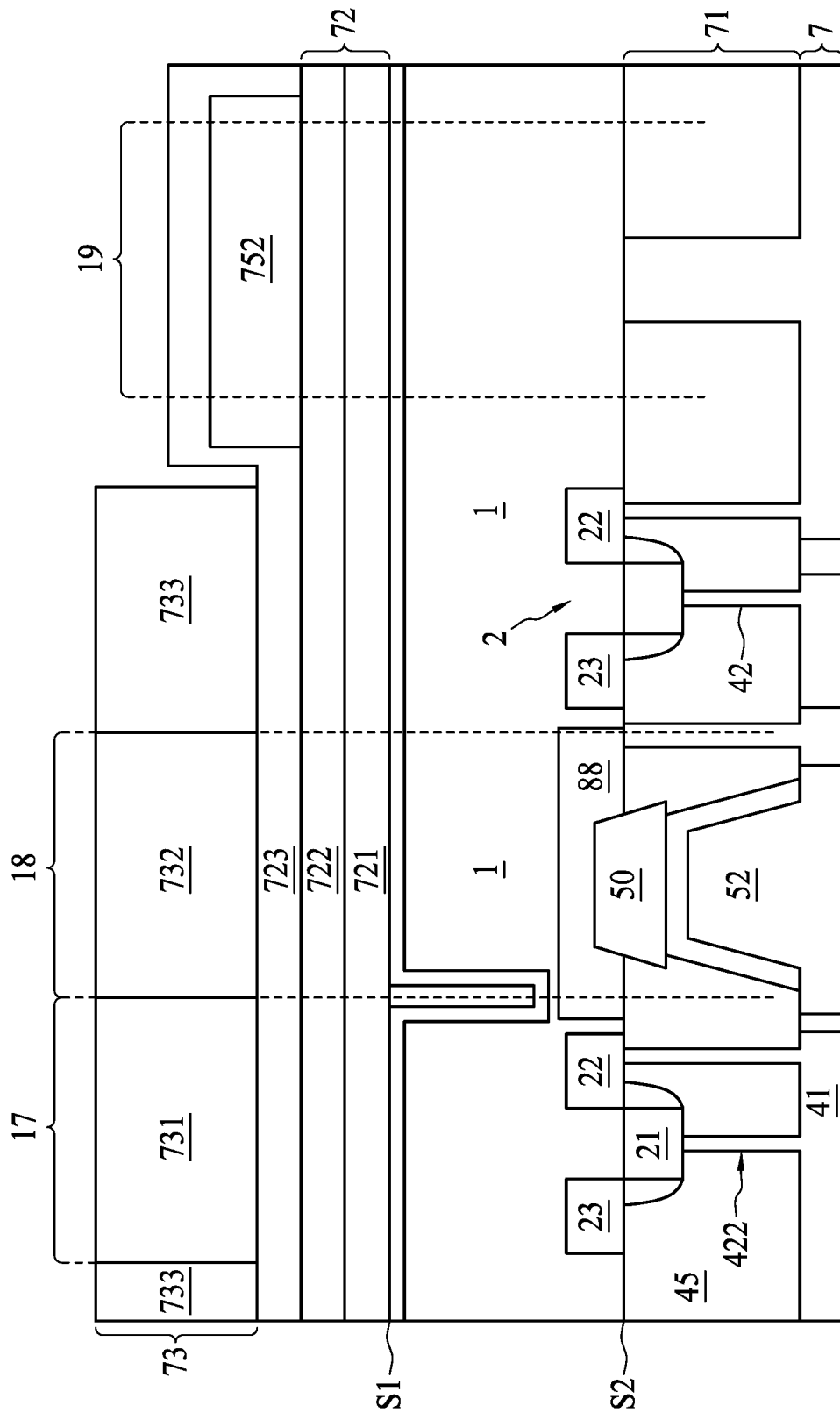

In FIG. 24, the portion 732 remained is a color filter 732. The color filter 732 is aligned within the pixel region 18. Color filter 731 and a color filter 733 are formed sequentially by a similar operation as the operation for forming the color filter 732, except that a different color resist is used.

Figure 25:
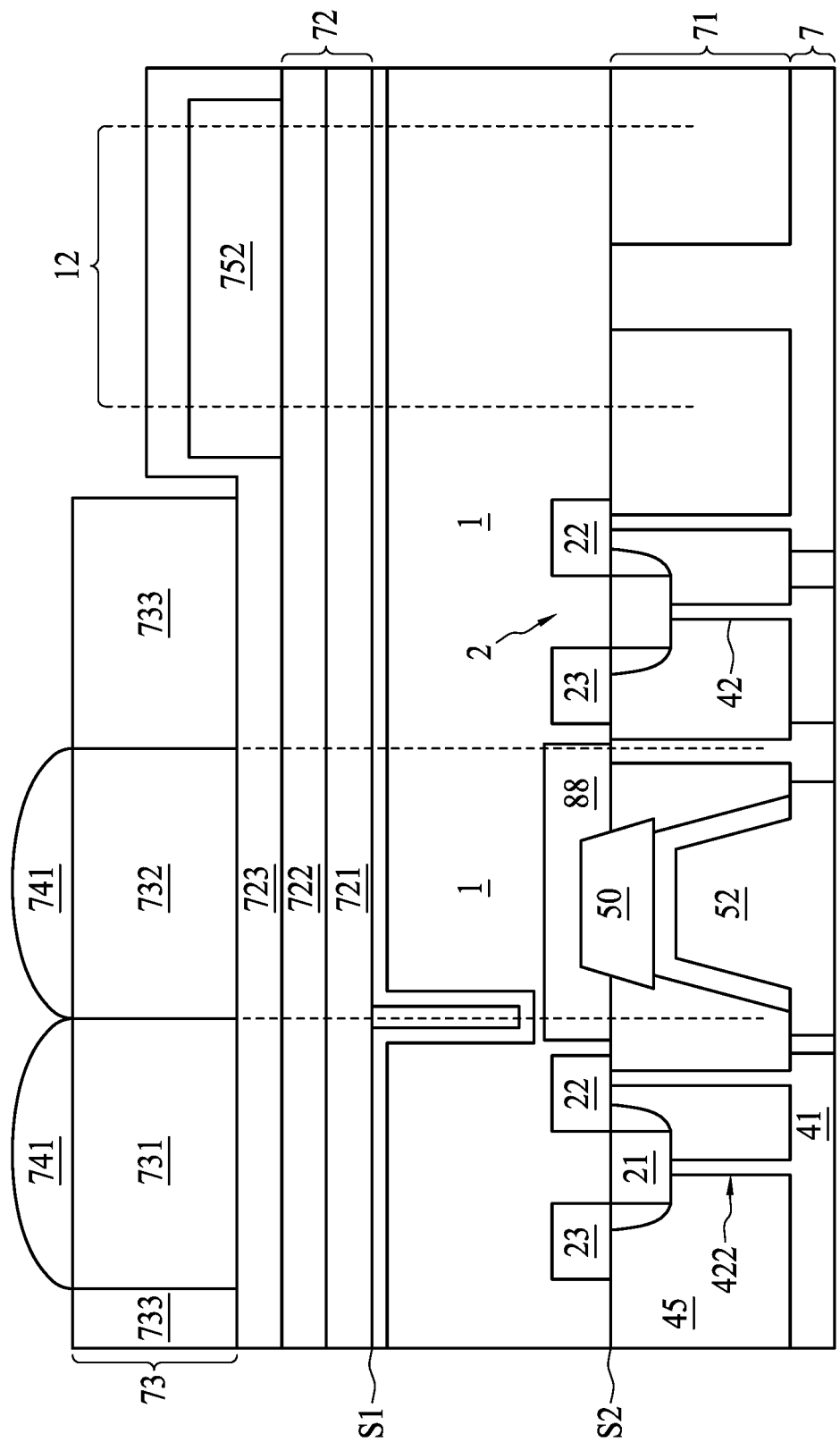

In FIG. 25, microlenses 741 are formed on top of color filter array 73. Microlenses 741 are formed aligned vertically with color filter 732 or color filter 731.

Some embodiments of the present disclosure provide a back side illuminated (BSI) image sensor. The back side illuminated (BSI) image sensor includes a semiconductive substrate and an interlayer dielectric (ILD) layer at a front side of the semiconductive substrate. The ILD layer includes a dielectric layer over the semiconductive substrate and a contact partially buried inside the semiconductive substrate. The contact includes a silicide layer including a predetermined thickness proximately in a range from about 600 angstroms to about 1200 angstroms.

Some embodiments of the present disclosure provide a back side illuminated (BSI) image sensor. The BSI image sensor includes a semiconductive substrate including a silicon portion and an interlayer dielectric (ILD) layer at a front side of the semiconductive substrate. The ILD layer includes a dielectric layer on the front side and a contact plug surrounded by the dielectric layer and partially buried inside the silicon portion. The contact plug includes a salicide layer including a lattice structure. The lattice structure includes a {220} plane or a {311} plane configured to be measured with peaks on an X-ray diffraction pattern of the lattice structure.

Some embodiments of the present disclosure provide a method of manufacturing a back side illuminated (BSI) image sensor. The method includes receiving a semiconductive substrate; forming a dielectric layer on a front side of the semiconductive substrate; forming a recess in the dielectric layer such that the front side is exposed; forming a titanium layer inside the recess and under the front side of the semiconductive substrate by using a plasma ignition power in a predetermined range from about 600 watts to 900 watts; performing a first thermal anneal; performing a second thermal anneal; and forming a barrier layer inside the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A back side illuminated (BSI) image sensor, comprising:
   a semiconductive substrate; and
   an interlayer dielectric (ILD) layer at a front side of the semiconductive substrate, and the ILD layer comprising:
      a contact partially buried inside the semiconductive substrate, and the contact comprising:
         a silicide layer partially below the front side of the semiconductive substrate, wherein the silicide layer includes a first portion below the front side and a second portion above the front side, and a maximum width of the second portion is greater than a maximum width of the first portion, and a lattice structure of the silicide layer includes a {311} plane.

2. The BSI image sensor of claim 1, wherein the semiconductive substrate comprises a non-silicide portion.

3. The BSI image sensor of claim 1, wherein the-contact comprises a barrier layer lined conformally on top of the silicide layer.

4. The BSI image sensor of claim 1, wherein the silicide layer is a salicide layer comprising a titanium element.

5. The BSI image sensor of claim 1, wherein the {311} plane is configured to be measured with peaks on the X-ray diffraction pattern of the lattice structure.

6. The BSI image sensor of claim 1, wherein the silicide layer comprises a bottom surface substantially flat in contact with the semiconductive substrate.

7. A back side illuminated (BSI) image sensor, comprising:
   a semiconductive substrate comprising a silicon portion; and
   an interlayer dielectric (ILD) layer at a front side of the semiconductive substrate, and the ILD layer comprising:
      a dielectric layer on the front side; and
      a contact plug surrounded by the dielectric layer and partially buried inside the silicon portion, and the contact plug comprising:
         a salicide layer partially below and partially over the front side of the semiconductive substrate, wherein a cross-sectional view of the salicide layer shows a trapezoid shape with an upper base greater than a lower base, and a lattice structure of the salicide layer includes a {040} plane or a {022} plane.

8. The BSI image sensor of claim 7, wherein the silicon portion comprises a material void of metal or dopant.

9. The BSI image sensor of claim 7, wherein the {040} plane is configured to be measured with peaks on the X-ray diffraction pattern of the lattice structure.

10. The BSI image sensor of claim 7, wherein the contact comprises a barrier layer and a conductive plug over the salicide layer.

11. The BSI image sensor of claim 7, wherein the {022} plane is configured to be measured with peaks on the X-ray diffraction pattern of the lattice structure.

12. The BSI image sensor of claim 7, wherein the salicide layer comprises a bottom surface and a top surface, and the bottom surface being substantially parallel with the top surface and the front side.

13. The BSI image sensor of claim 7, wherein the salicide layer comprises a titanium element.

14. A back side illuminated (BSI) image sensor, comprising:
   a semiconductive substrate; and
   an interlayer dielectric (ILD) layer at a front side of the semiconductive substrate, and the ILD layer comprising:

a contact partially buried inside the semiconductive substrate, and the contact comprising:
   a conductive material;
   a salicide layer partially below and partially over the front side of the semiconductive substrate; and
   a barrier layer between the silicide layer and a conductive material inside the contact, wherein the salicide layer is in a tapered shape, and a radius of the salicide layer monotonically decrease from a top of the salicide layer to a bottom of the salicide layer, and a lattice structure of the salicide layer includes a {220} plane.

15. The BSI image sensor of claim 14, wherein the silicide layer comprises an upper portion in the ILD layer, and a lower portion in the semiconductive substrate.

16. The BSI image sensor of claim 14, wherein the contact further comprises a thin film conductive layer lined between the ILD layer and the barrier layer.

17. The BSI image sensor of claim 14, wherein the barrier layer is a thin film such that an area of a bottom side of the conductive material is the same as an area of a bottom side of the barrier layer.

18. The BSI image sensor of claim 14, wherein the conductive material is partially surrounded by the barrier layer at a bottom side and at a lateral side.

19. The BSI image sensor of claim 14, wherein the conductive material is in contact with an interconnection at a top of the conductive material.

20. The BSI image sensor of claim 14, wherein the {220} plane is configured to be measured with a peak having an intensity higher than the peak corresponding to the {311} plane on the X-ray diffraction pattern of the lattice structure.

* * * * *